(12) United States Patent
Maejima

(10) Patent No.: US 8,699,271 B2
(45) Date of Patent: Apr. 15, 2014

(54) SEMICONDUCTOR MEMORY DEVICE

(75) Inventor: Hiroshi Maejima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 13/424,658

(22) Filed: Mar. 20, 2012

(65) Prior Publication Data
US 2013/0058166 A1  Mar. 7, 2013

(30) Foreign Application Priority Data

Sep. 7, 2011  (JP) .................................. 2011-194988

(51) Int. Cl.
G11C 11/34 (2006.01)
G11C 16/04 (2006.01)
G11C 16/10 (2006.01)
G11C 7/00 (2006.01)
G11C 11/56 (2006.01)

(52) U.S. Cl.
CPC ............ *G11C 16/10* (2013.01); *G11C 16/0483* (2013.01); *G11C 11/5628* (2013.01)
USPC ............. 365/185.19; 365/185.02; 365/185.17

(58) Field of Classification Search
CPC . G11C 16/10; G11C 11/5628; G11C 16/0483
USPC ............................ 365/185.02, 185.17, 185.19
See application file for complete search history.

(56) References Cited

U.S. PATENT DOCUMENTS

| 7,859,902 | B2 | 12/2010 | Maejima |
| 8,102,711 | B2 | 1/2012 | Maejima |
| 2008/0049494 | A1* | 2/2008 | Aritome .................... 365/185.02 |
| 2010/0067305 | A1* | 3/2010 | Park et al. ................ 365/185.19 |
| 2012/0120727 | A1* | 5/2012 | Kim et al. ................ 365/185.17 |

FOREIGN PATENT DOCUMENTS

| JP | 2009-266946 | 11/2009 |
| JP | 2010-080003 A | 4/2010 |

OTHER PUBLICATIONS

U.S. Appl. No. 13/336,122, filed Dec. 23, 2011, Hiroshi Maejima.
Office Action issued Feb. 4, 2014 in Japanese Patent Application No. 2011-1949988 filed Sep. 7, 2011 (with English Translation).

* cited by examiner

*Primary Examiner* — Ly D Pham
(74) *Attorney, Agent, or Firm* — Oblon, Spivak, McClelland, Maier & Neustadt, L.L.P.

(57) ABSTRACT

According to one embodiment, a semiconductor memory device includes memory cells, word lines, a driver circuit, and a control circuit. The memory cells are stacked above a semiconductor substrate, and each includes a charge accumulation layer and control gate. The word lines are coupled to the control gates. The driver circuit repeats a programming operation to write data in a memory cell coupled to a selected word line. In the programming operation, a first voltage is applied to the selected word line, a second voltage to a first unselected word line, and a third voltage to a second unselected word line. The control circuit steps up the first voltage and steps down the second voltage in repeating the programming.

18 Claims, 17 Drawing Sheets

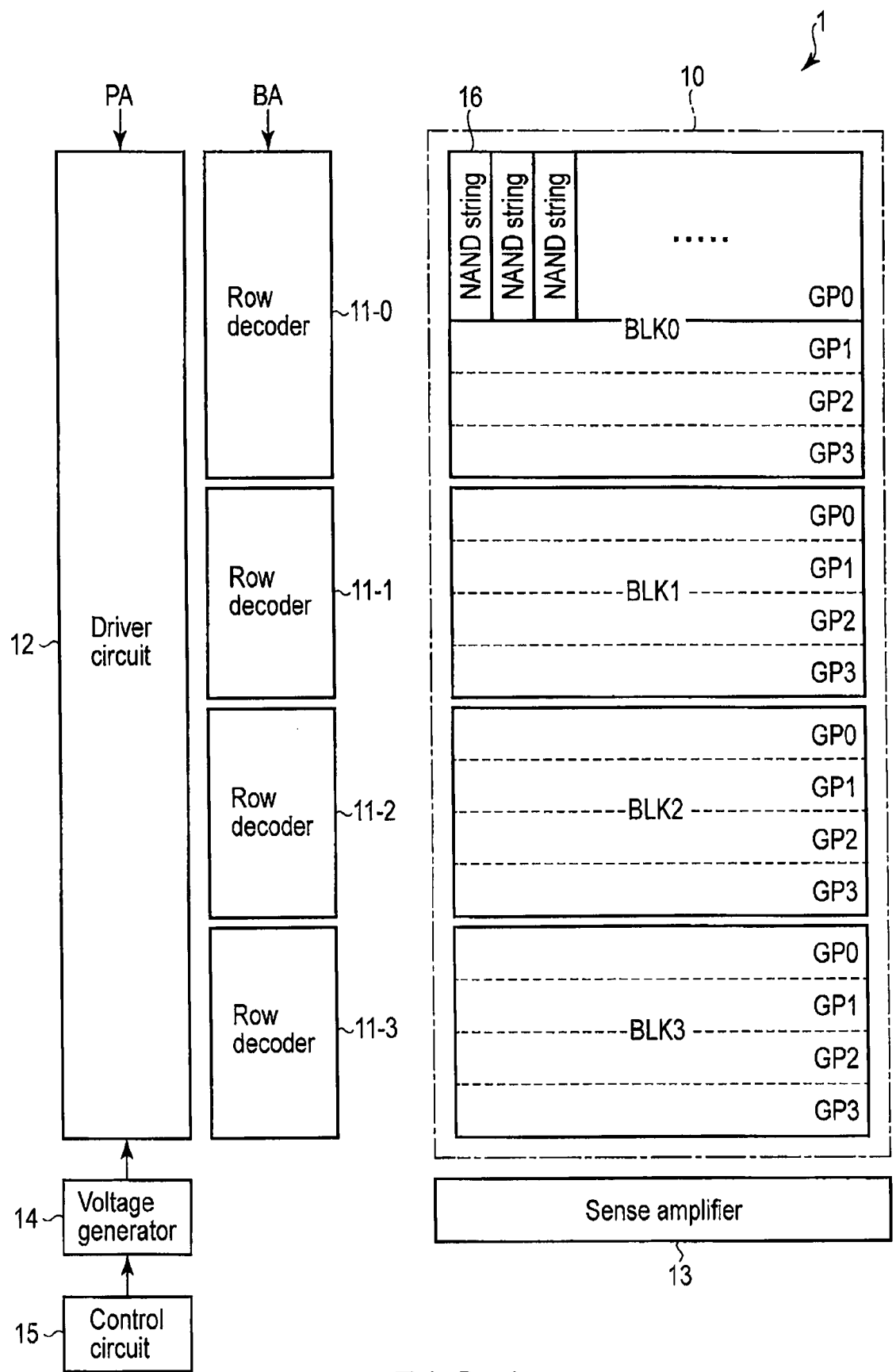
F I G. 1

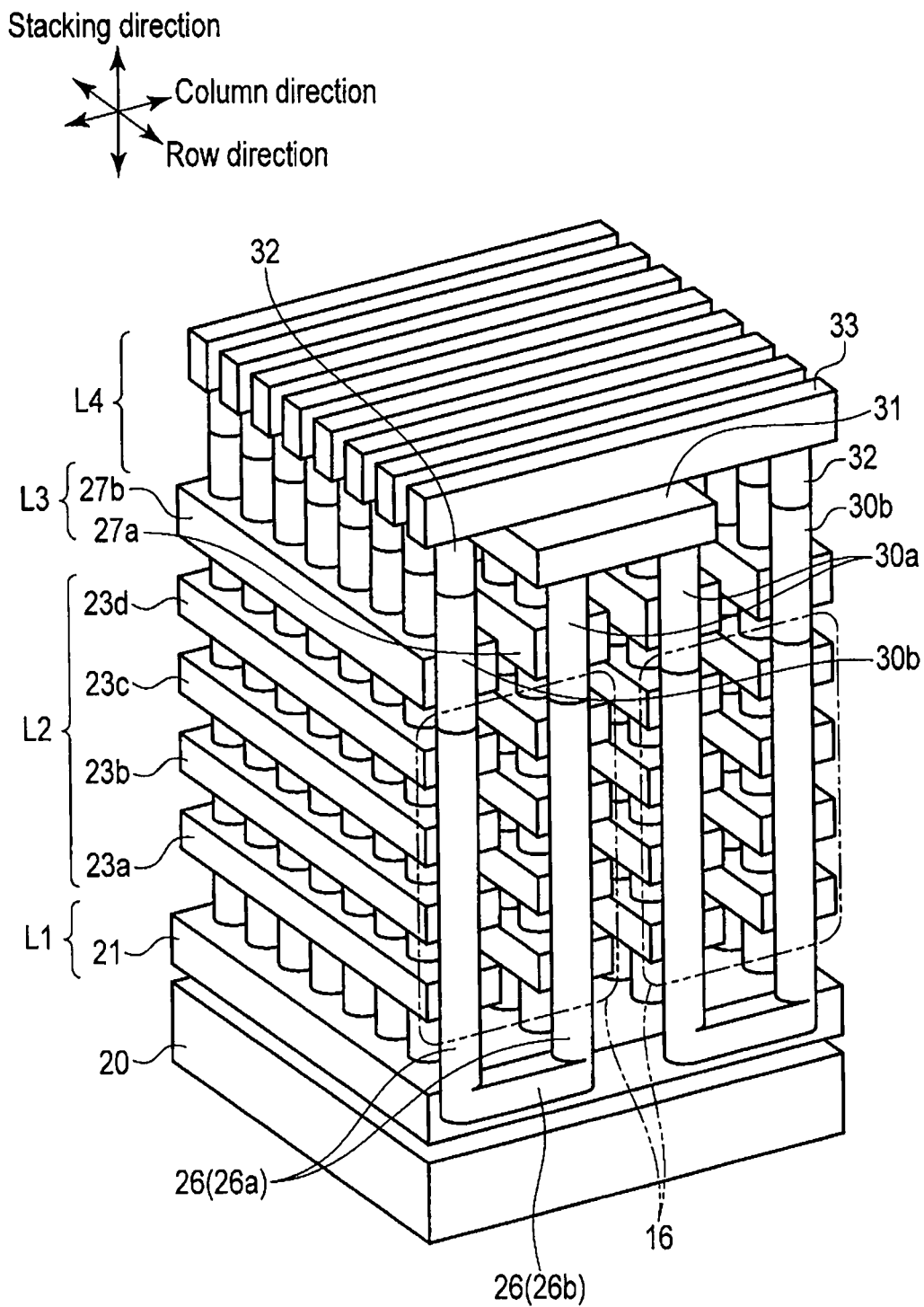
F I G. 3

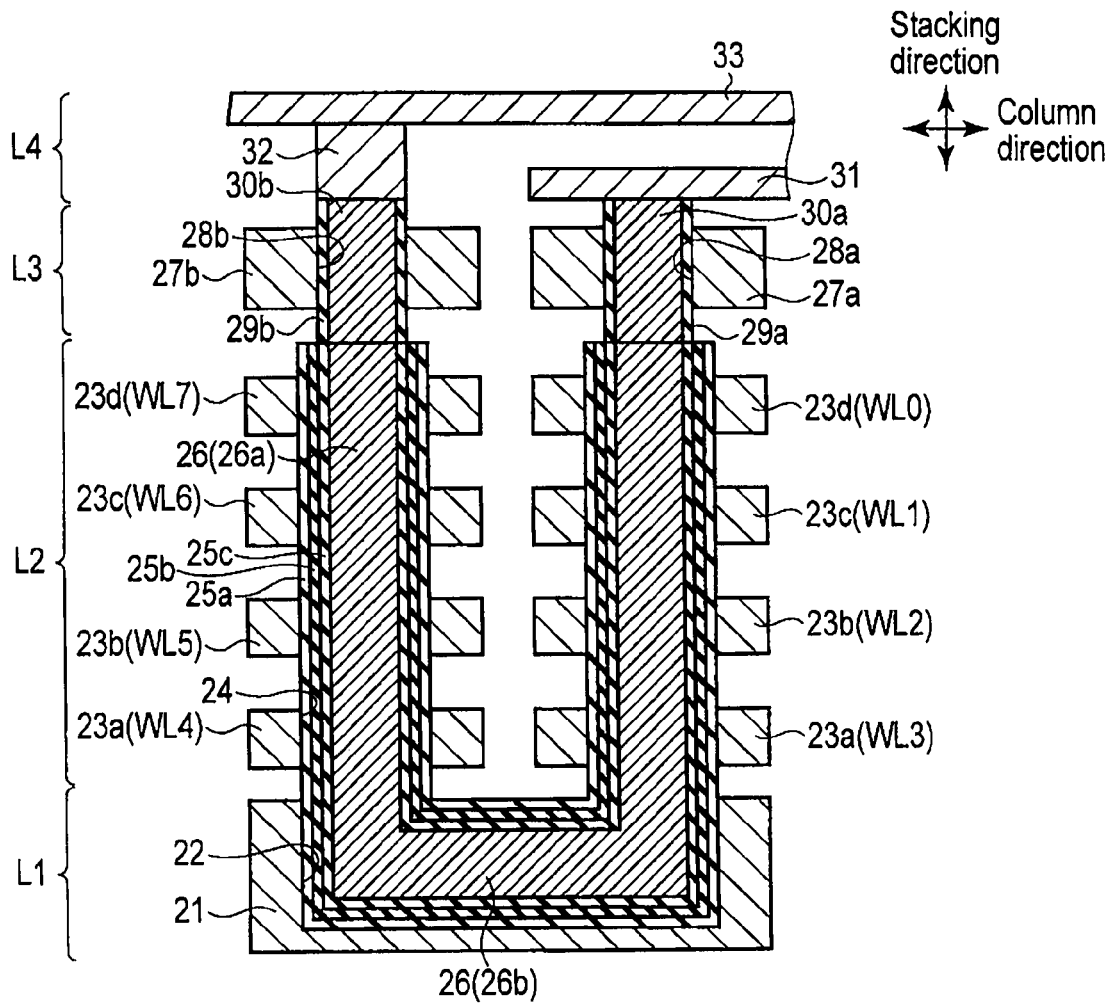
F I G. 4
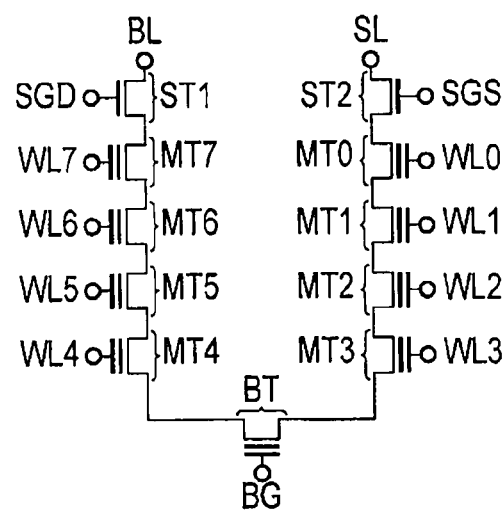
F I G. 5

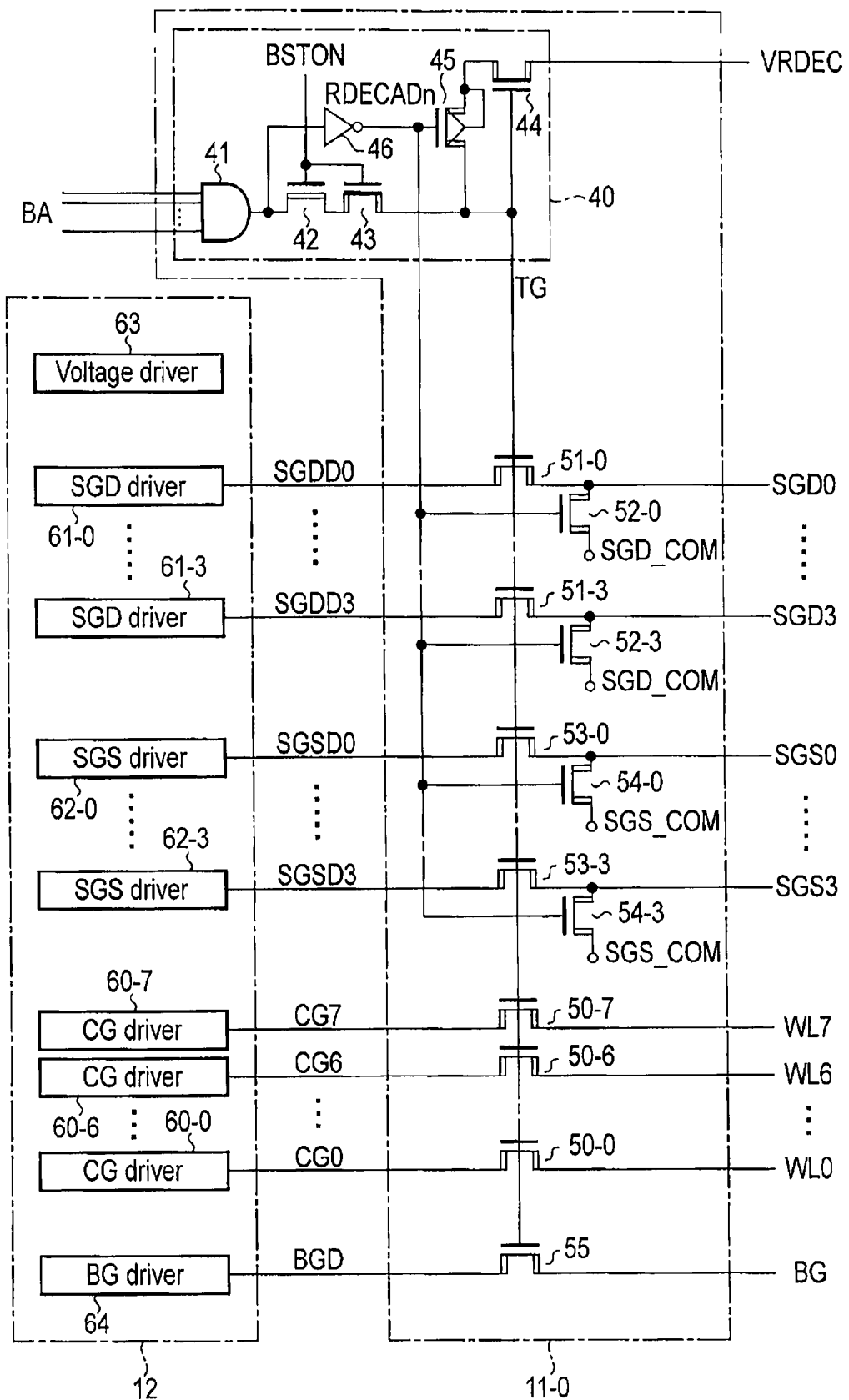
F I G. 6

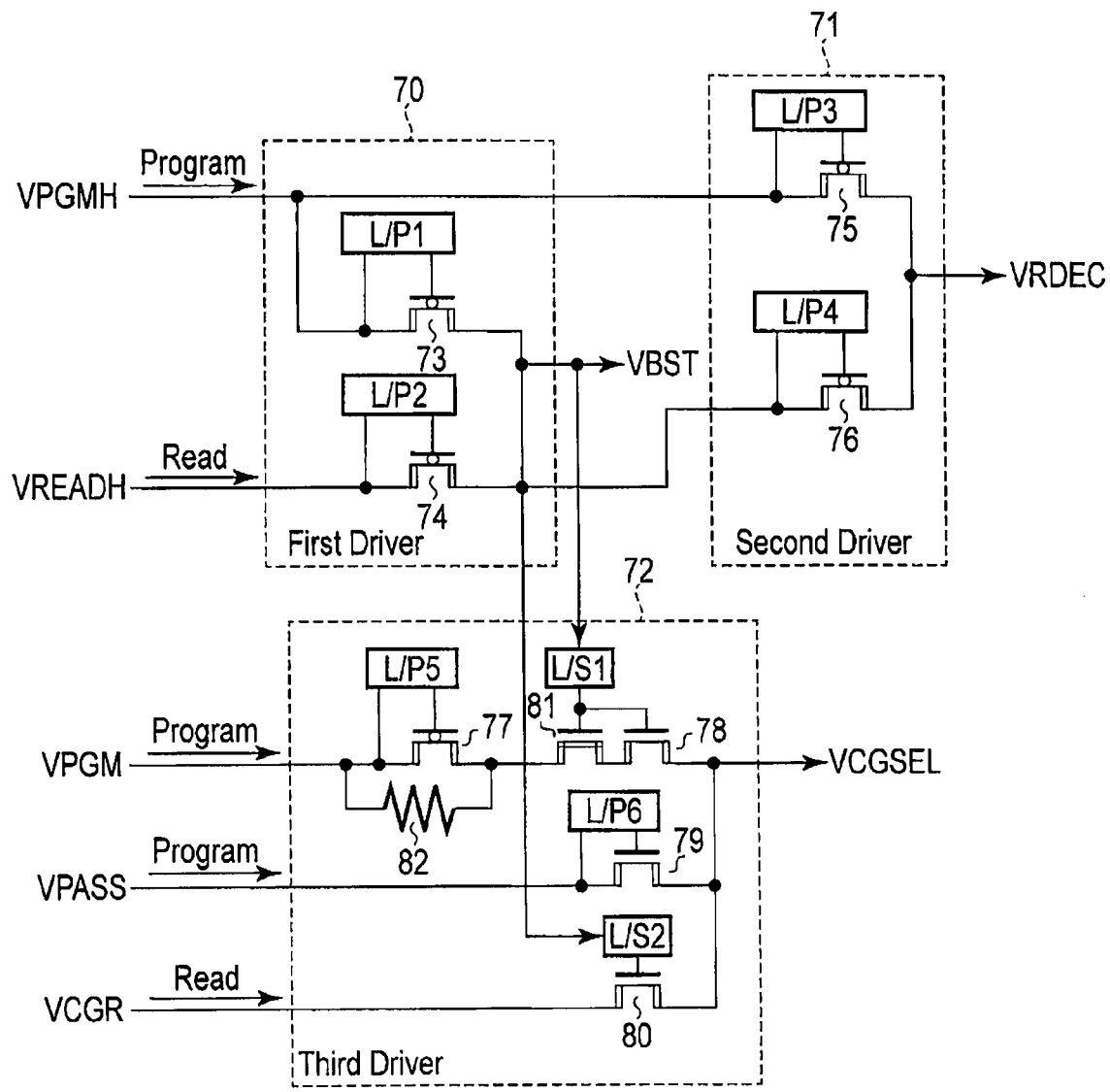
F I G. 7
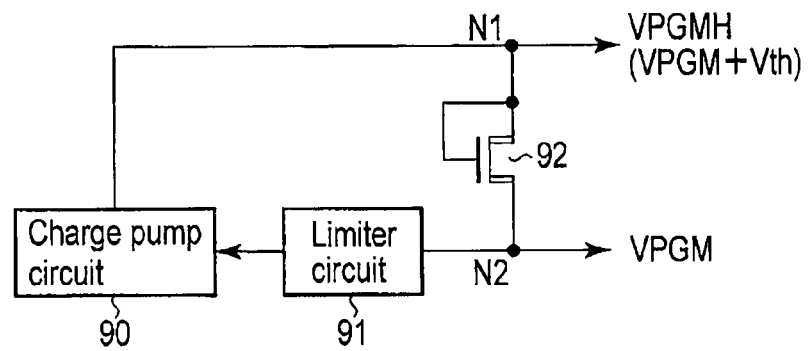
F I G. 8

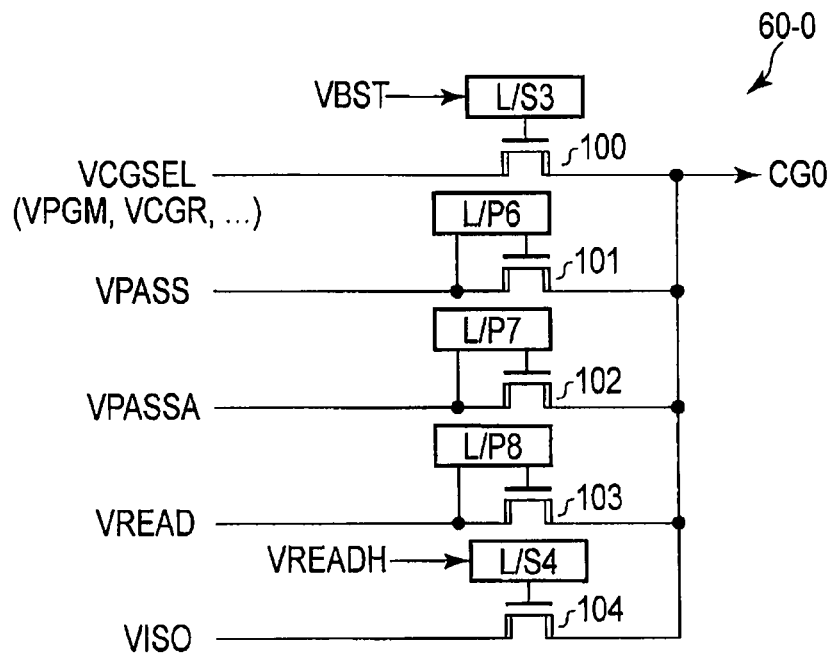
F I G. 9
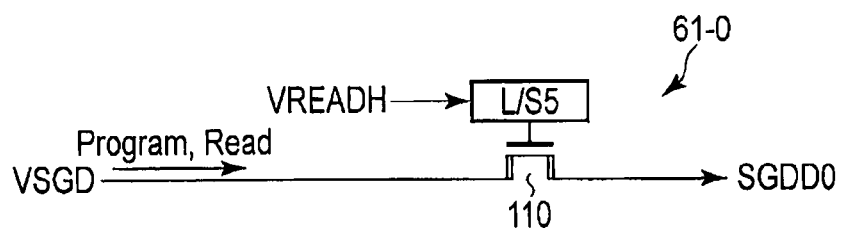
F I G. 10
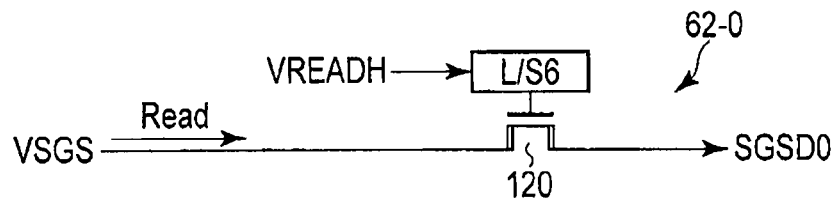
F I G. 11

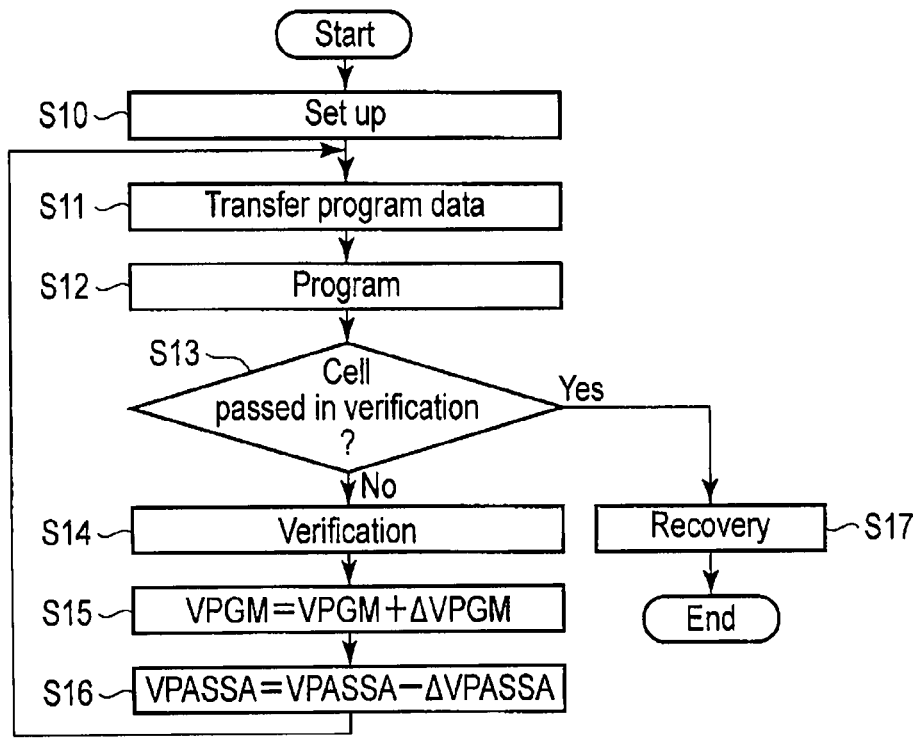
F I G. 1 2
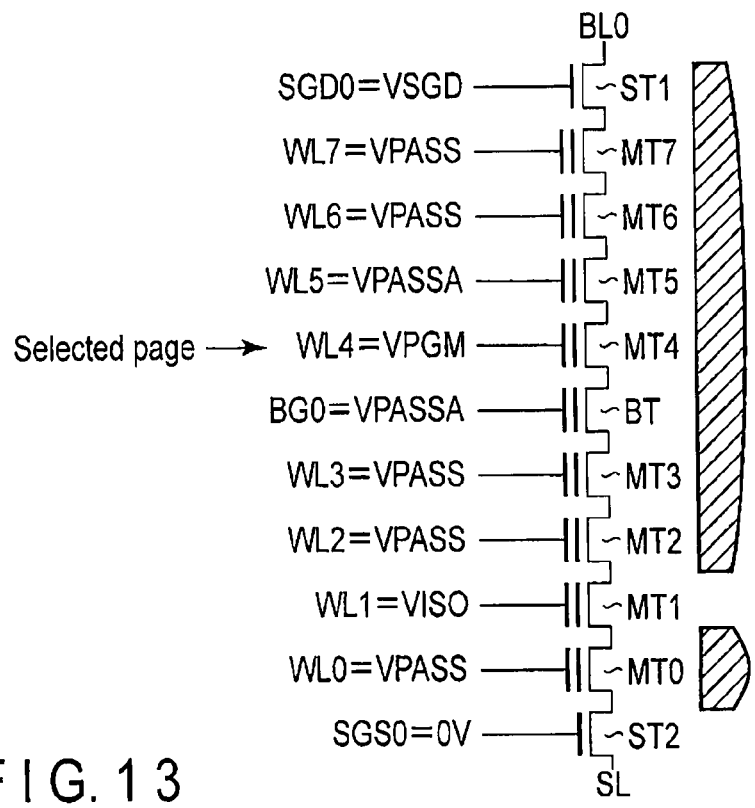
F I G. 1 3

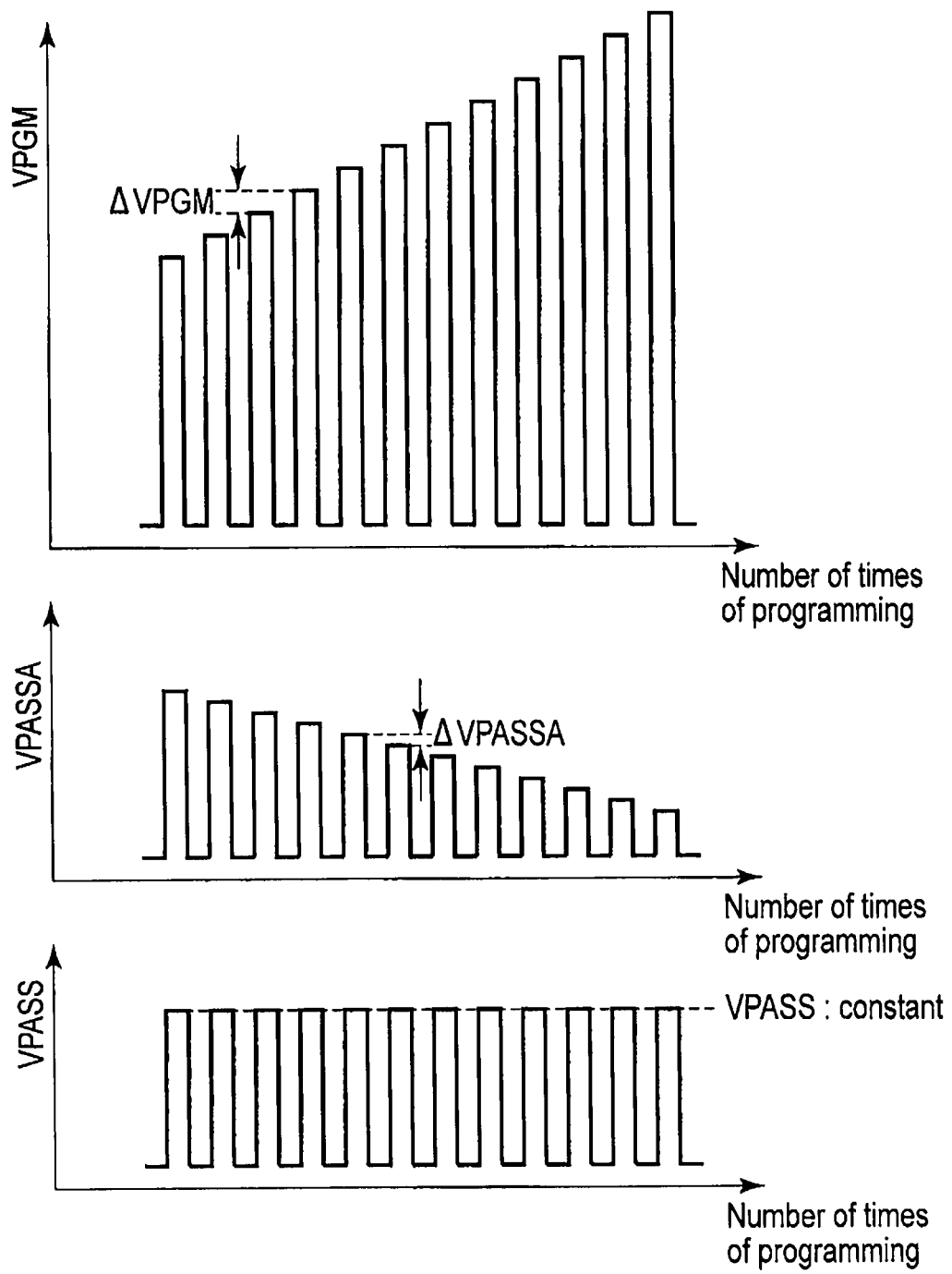
F I G. 14

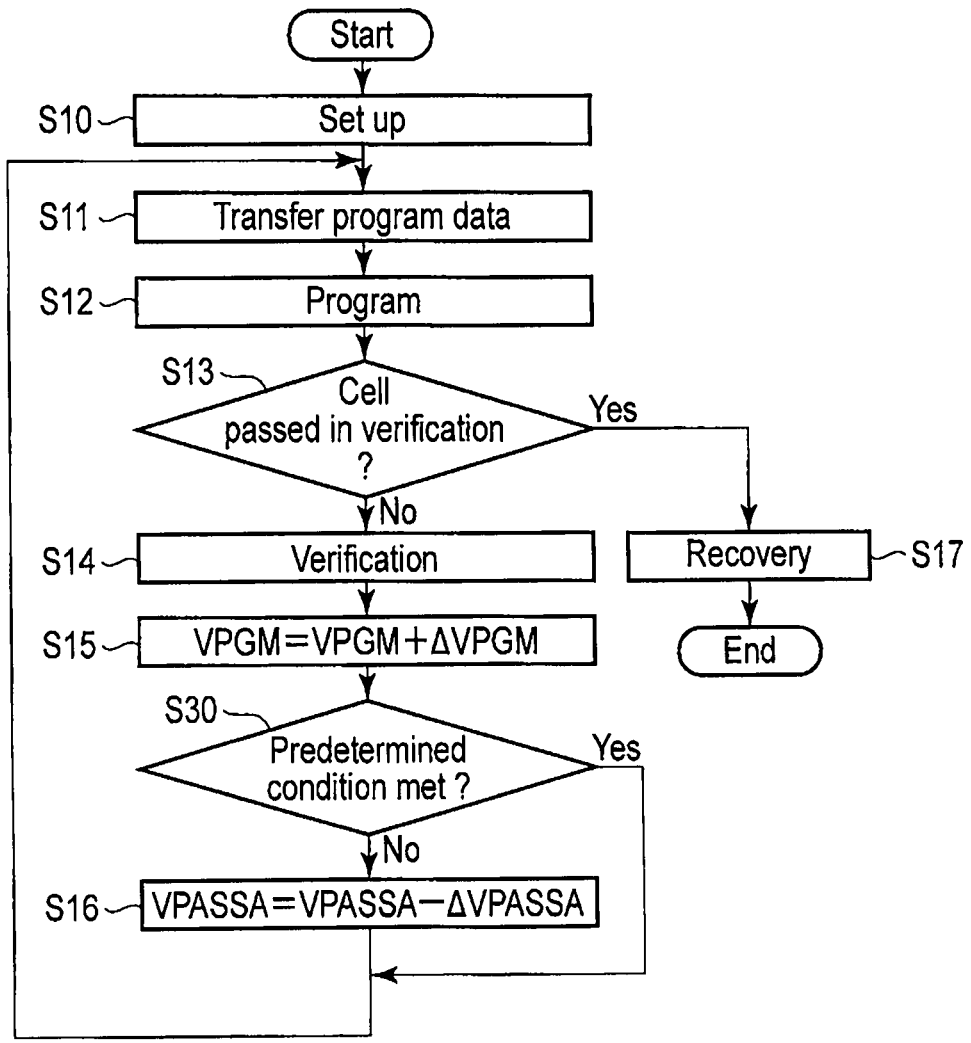
F I G. 19

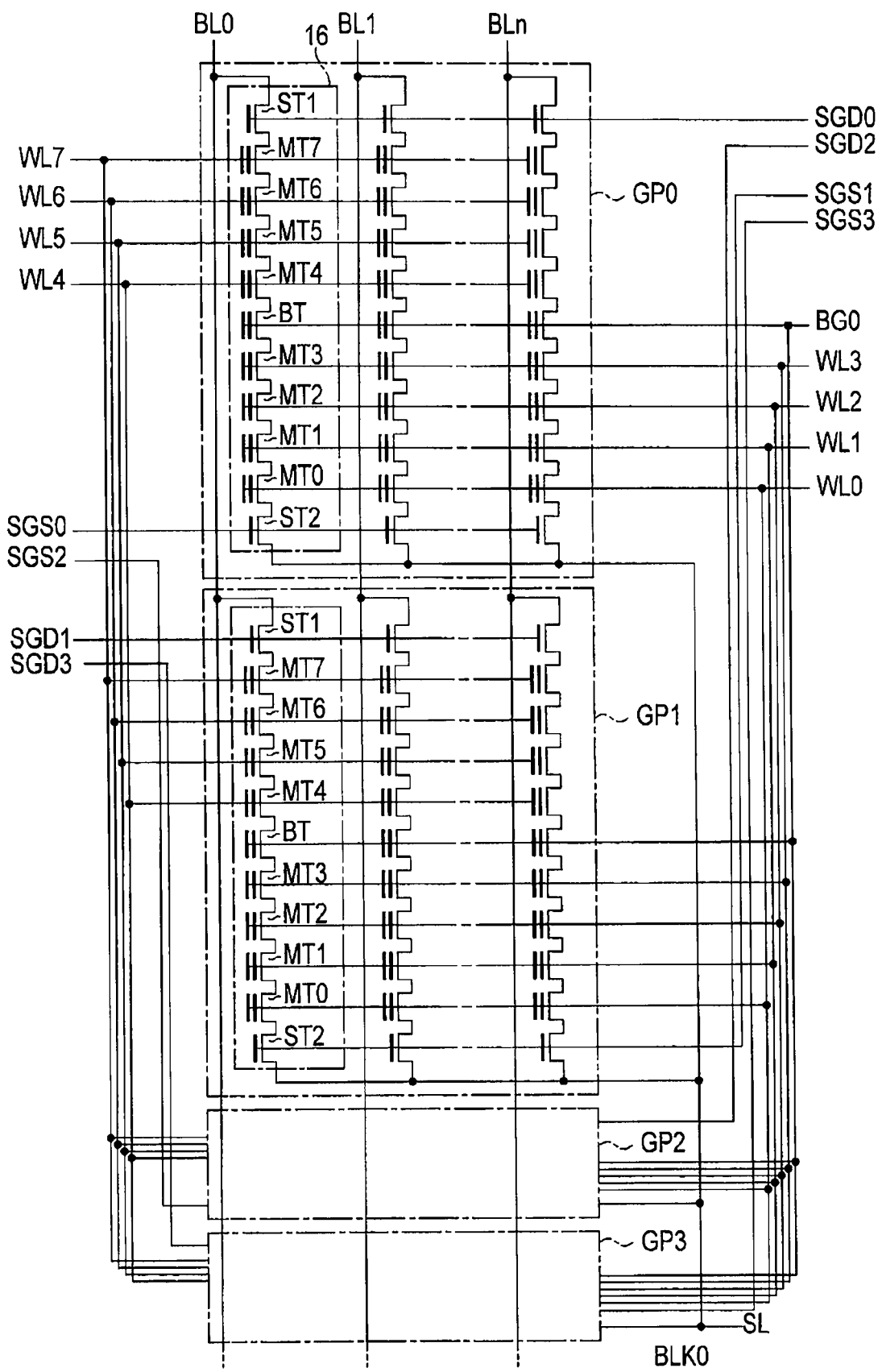
F I G. 25

SEMICONDUCTOR MEMORY DEVICE

CROSS-REFERENCE TO RELATED APPLICATIONS

This application is based upon and claims the benefit of priority from prior Japanese Patent Application No. 2011-194988, filed Sep. 7, 2011, the entire contents of which are incorporated herein by reference.

FIELD

Embodiments described herein relate generally to a semiconductor memory device.

BACKGROUND

Recently, a NAND flash memory in which memory cells are three-dimensionally arranged is known.

BRIEF DESCRIPTION OF THE. DRAWINGS

FIG. 1 is a block diagram of a semiconductor memory device according to the first embodiment;

FIGS. 2, 3, and 4 are a circuit diagram, perspectively view, and sectional view, respectively, of a memory cell array according to the first embodiment;

FIG. 5 is a circuit diagram of a NAND string according to the first embodiment;

FIG. 6 is a block diagram of a row decoder and driver circuit according to the first embodiment;

Figure 15:
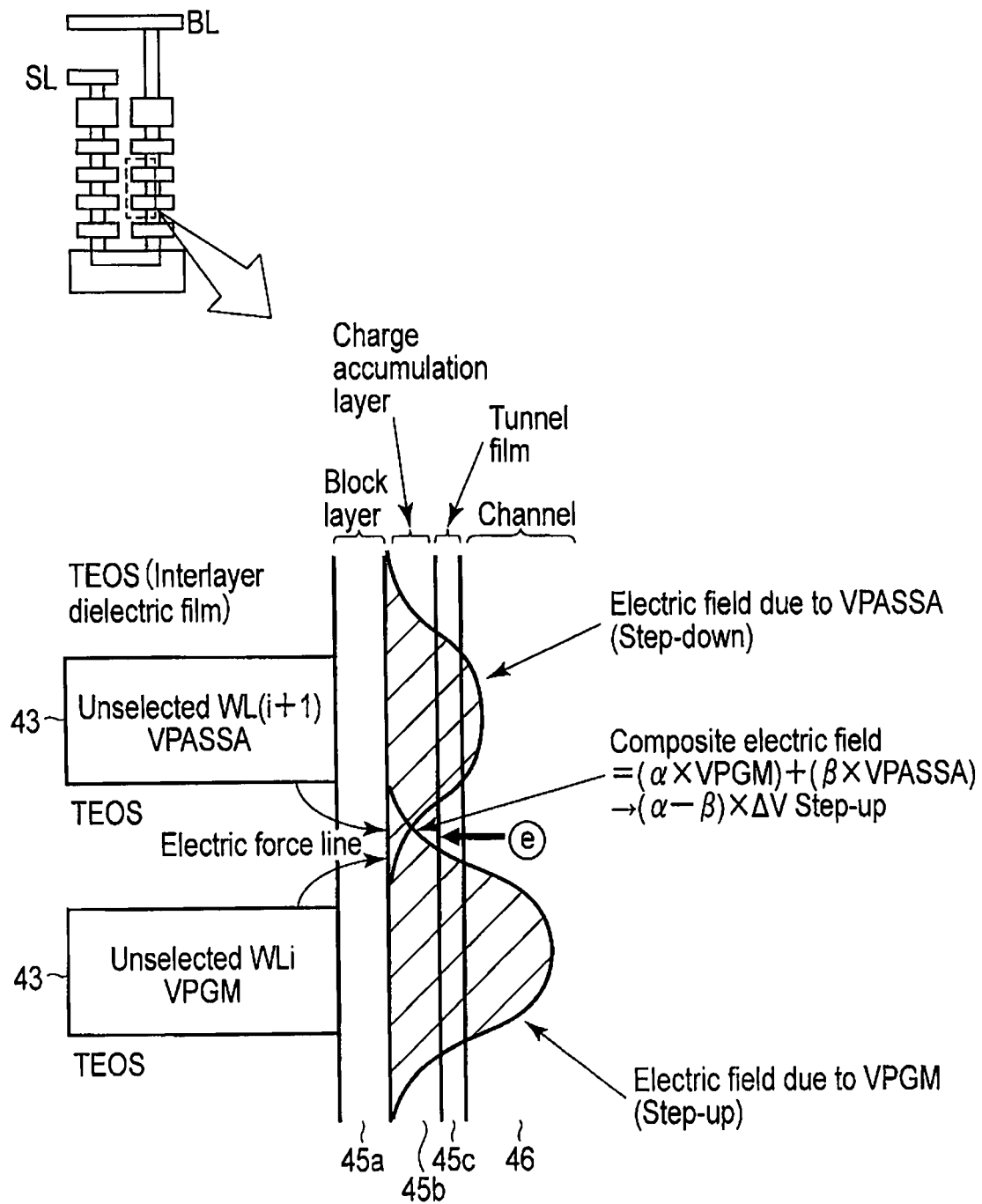
Figure 16:
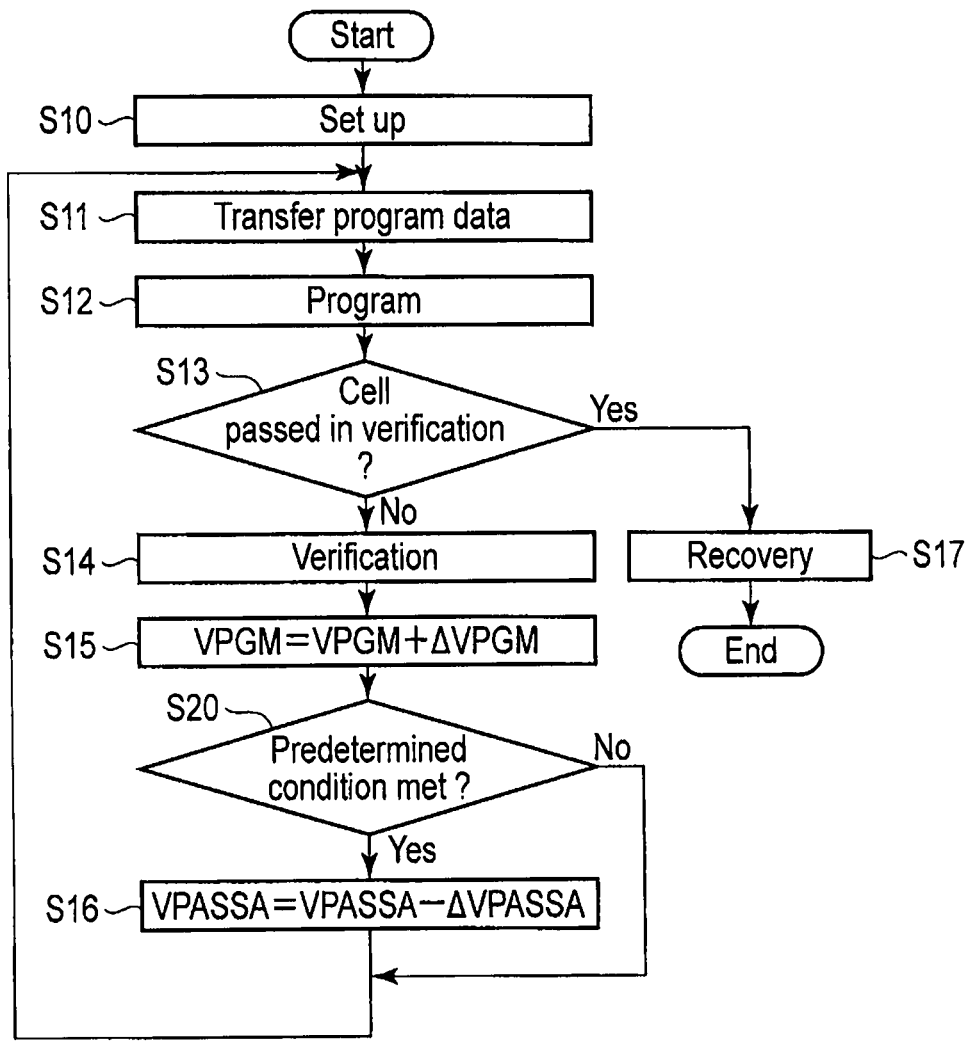
Figure 17:
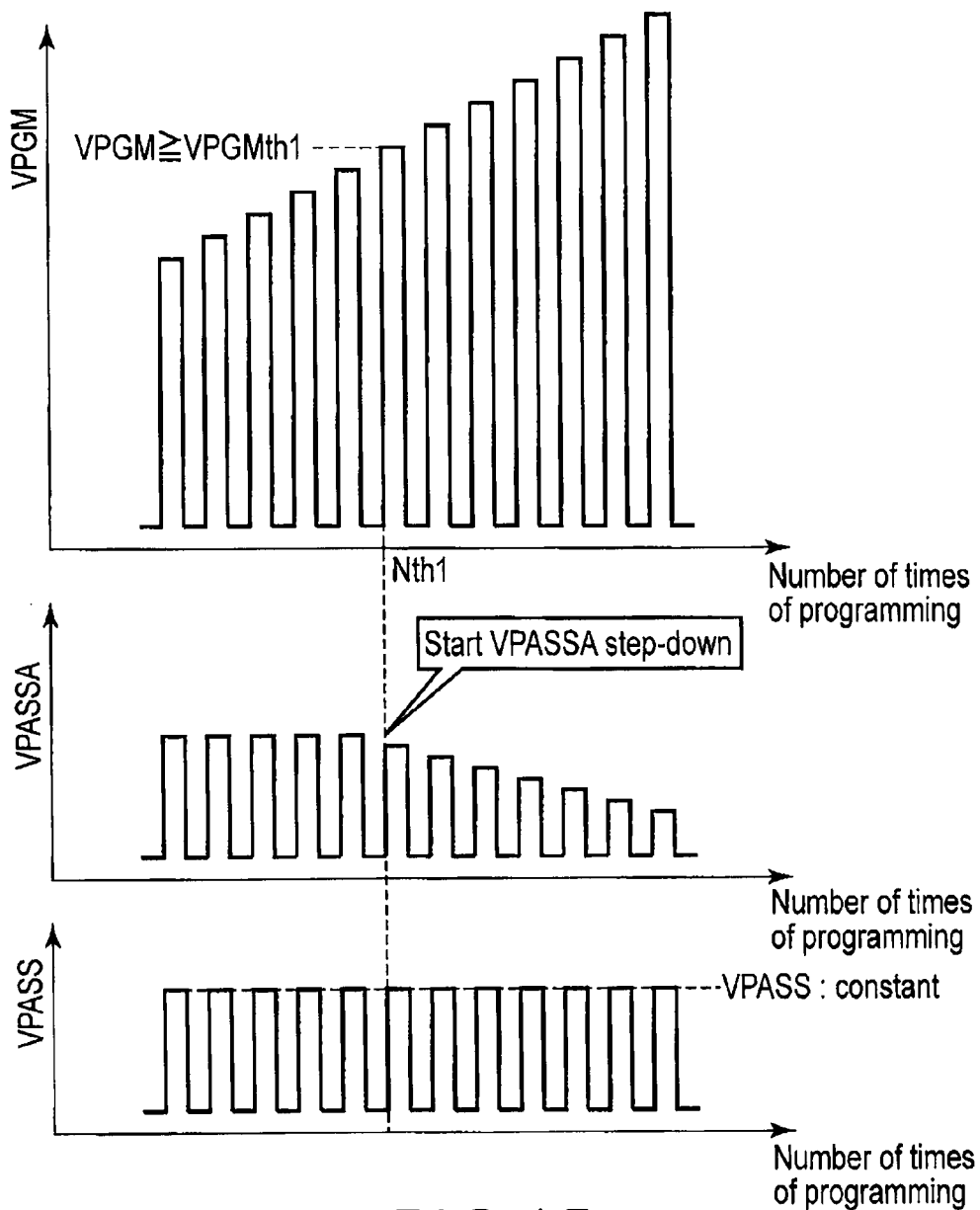
Figure 18:
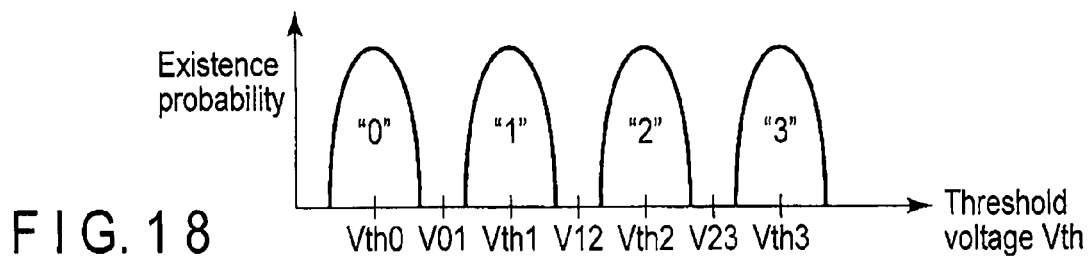
Figure 20:
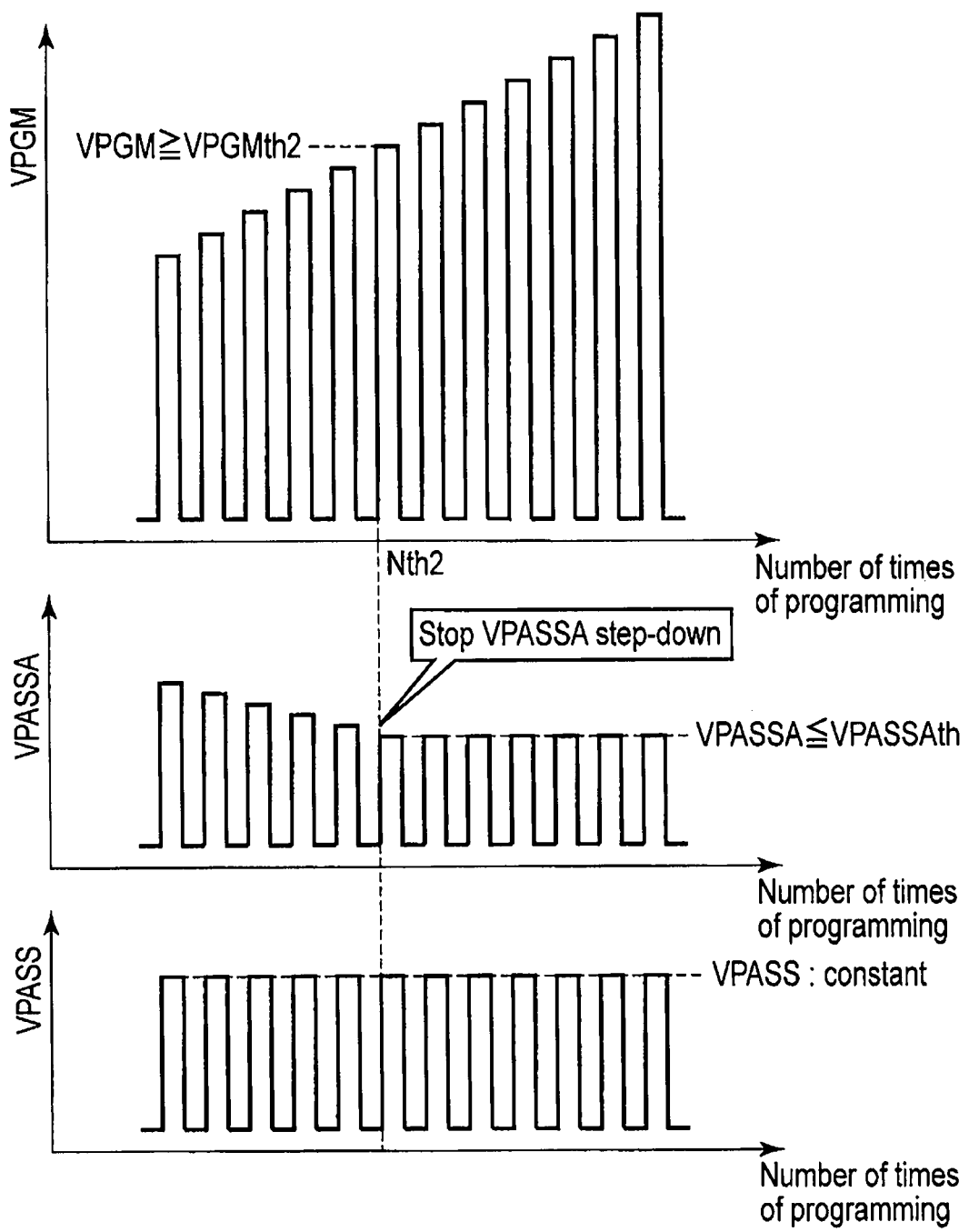
Figure 21:
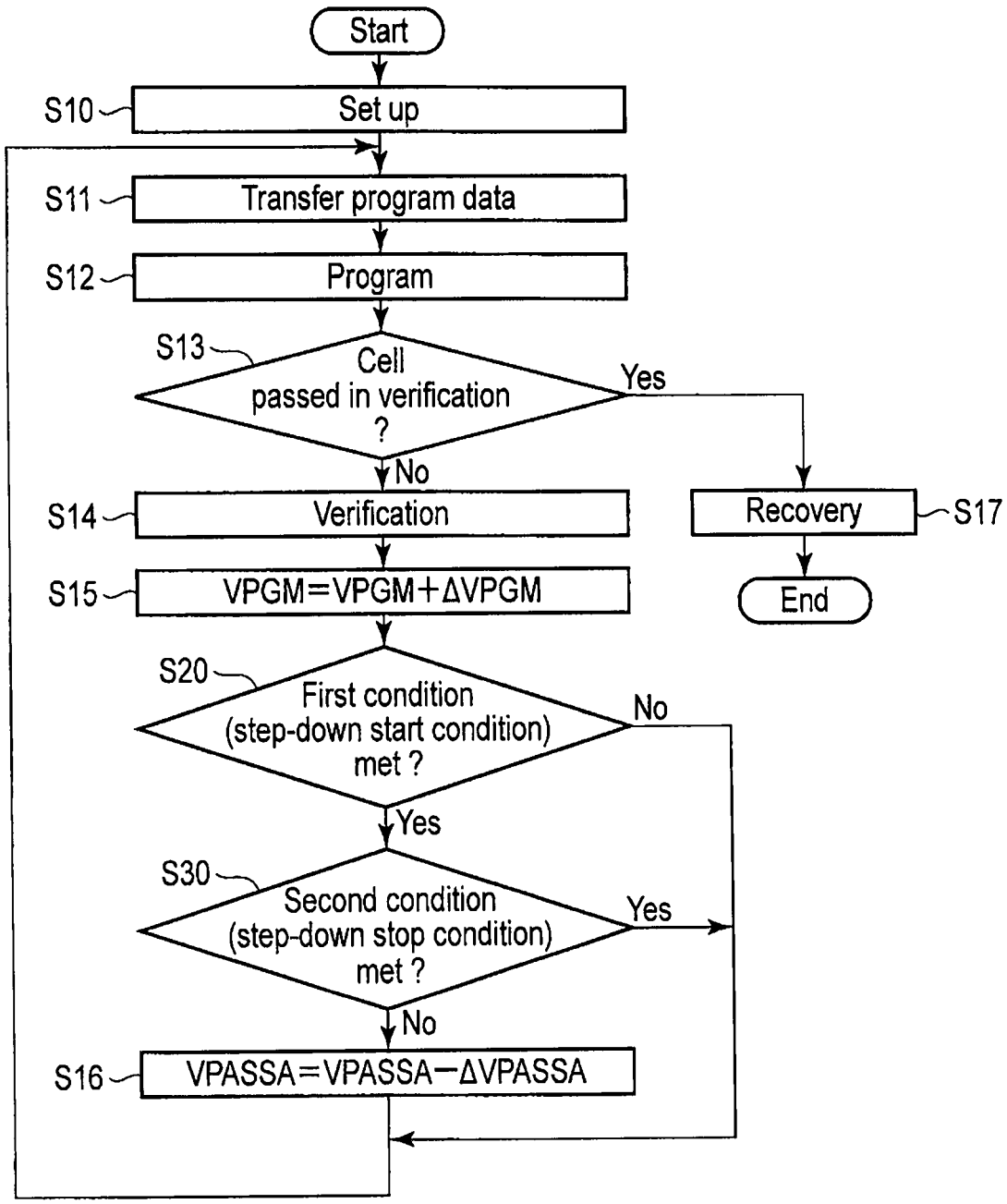
Figure 22:
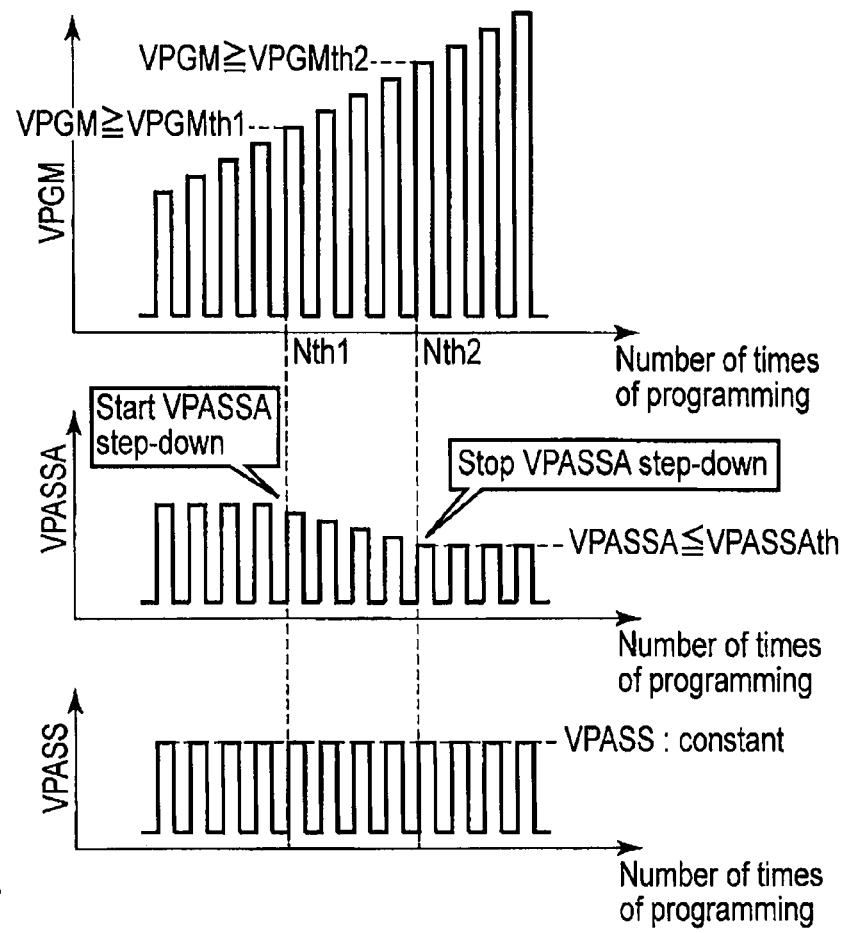
Figure 23:
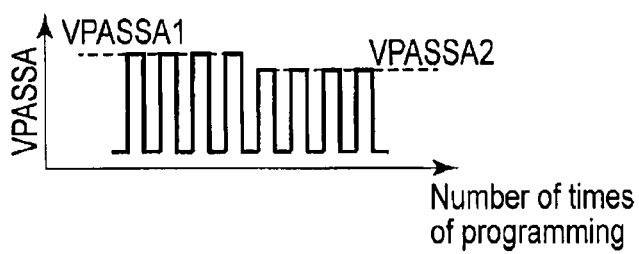
Figure 24:
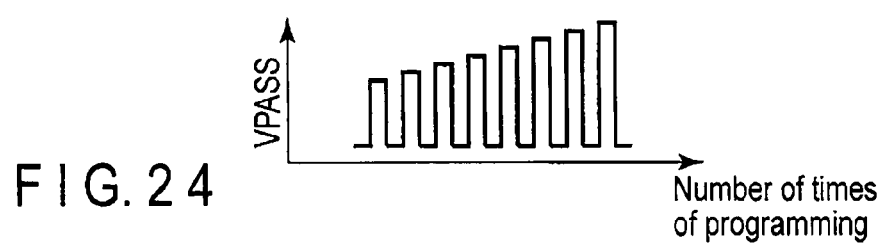

FIGS. 7, 8, and 9 are circuit diagrams of a voltage driver, voltage generator, and CG driver, respectively, according to the first embodiment;

FIGS. 10 and 11 are circuit diagrams of an SGD driver and SGS driver, respectively, according to the first embodiment;

FIG. 12 is a flowchart of a data write method according to the first embodiment;

FIG. 13 is a circuit diagram of a NAND string according to the first embodiment;

FIG. 14 is a timing chart of various voltages according to the first embodiment;

FIG. 15 is a sectional view of a memory cell according to the first embodiment;

FIG. 16 is a flowchart of a data write method according to the second embodiment;

FIG. 17 is a timing chart of various voltages according to the second embodiment;

FIG. 18 is a graph showing the threshold distribution of a memory cell according to a modification of the second embodiment;

FIG. 19 is a flowchart of a data write method according to the third embodiment;

FIG. 20 is a timing chart of various voltages according to the third embodiment;

FIG. 21 is a flowchart of a data write method according to the fourth embodiment;

FIG. 22 is a timing chart of various voltages according to the fourth embodiment;

FIGS. 23 and 24 are timing charts of voltages VPASSA and VPASS, respectively, according to modifications of the first to fourth embodiments; and FIG. 25 is a circuit diagram of a memory cell array according to a modification of the first to fourth embodiments.

DETAILED DESCRIPTION

In general, according to one embodiment, a semiconductor memory device includes: a plurality of memory cells; a plurality of word lines; a driver circuit; and a control circuit. The memory cells are stacked above a semiconductor substrate, and include current paths coupled in series, and each includes a charge accumulation layer and control gate. The word lines are coupled to the control gates. The driver circuit repeats a programming operation to write data in a memory cell coupled to a selected word line. In the programming operation, a first voltage is applied to the selected word line, a second voltage to a first unselected word line, and a third voltage to a second unselected word line. The control circuit steps up the first voltage and steps down the second voltage in repeating the programming.

[First Embodiment]

A semiconductor memory device according to the first embodiment will be explained below. This semiconductor memory device will be explained by taking, as an example, a three-dimensionally stacked NAND flash memory in which memory cells are stacked on a semiconductor substrate.

1. Arrangement of Semiconductor Memory Device

First, the arrangement of the semiconductor memory device according to this embodiment will be explained.

1.1 Overall Arrangement of Semiconductor Memory Device

FIG. 1 is a block diagram of the semiconductor memory device according to this embodiment. As shown in FIG. 1, a NAND flash memory 1 includes a memory cell array 10, row decoders 11 (11-0 to 11-3), a driver circuit 12, a sense amplifier 13, a voltage generator 14, and a control circuit 15.

The memory cell array 10 includes a plurality of (in this embodiment, four) blocks BLK (BLK0 to BLK3) each of which is a set of nonvolatile memory cells. Data in the same block BLK is erased at once. Each block BLK includes a plurality of (in this embodiment, four) memory groups GP (GP0 to GP3) each of which is a set of NAND strings 16 in which memory cells are connected in series. The number of blocks in the memory cell array 10 and the number of memory groups in the block BLK are, of course, arbitrary numbers.

The row decoders 11-0, 11-1, 11-2, and 11-3 respectively associated with the blocks BLK0, BLK1, BLK2, and BLK3, and each select the row direction of an associated block BLK.

The driver circuit 12 applies voltages necessary for data write, read, and erase to the row decoders 11. The row decoders 11 apply these voltages to memory cells.

In data read, the sense amplifier senses and amplifies data read out from a memory cell. In data write, the sense amplifier transfers write data to a memory cell.

The voltage generator 14 generates the voltages necessary for data write, read, and erase, and applies these voltages to the driver circuit 12.

The control circuit 15 controls the operation of the whole NAND flash memory.

1.2 Memory Cell Array 10

Figure 2:
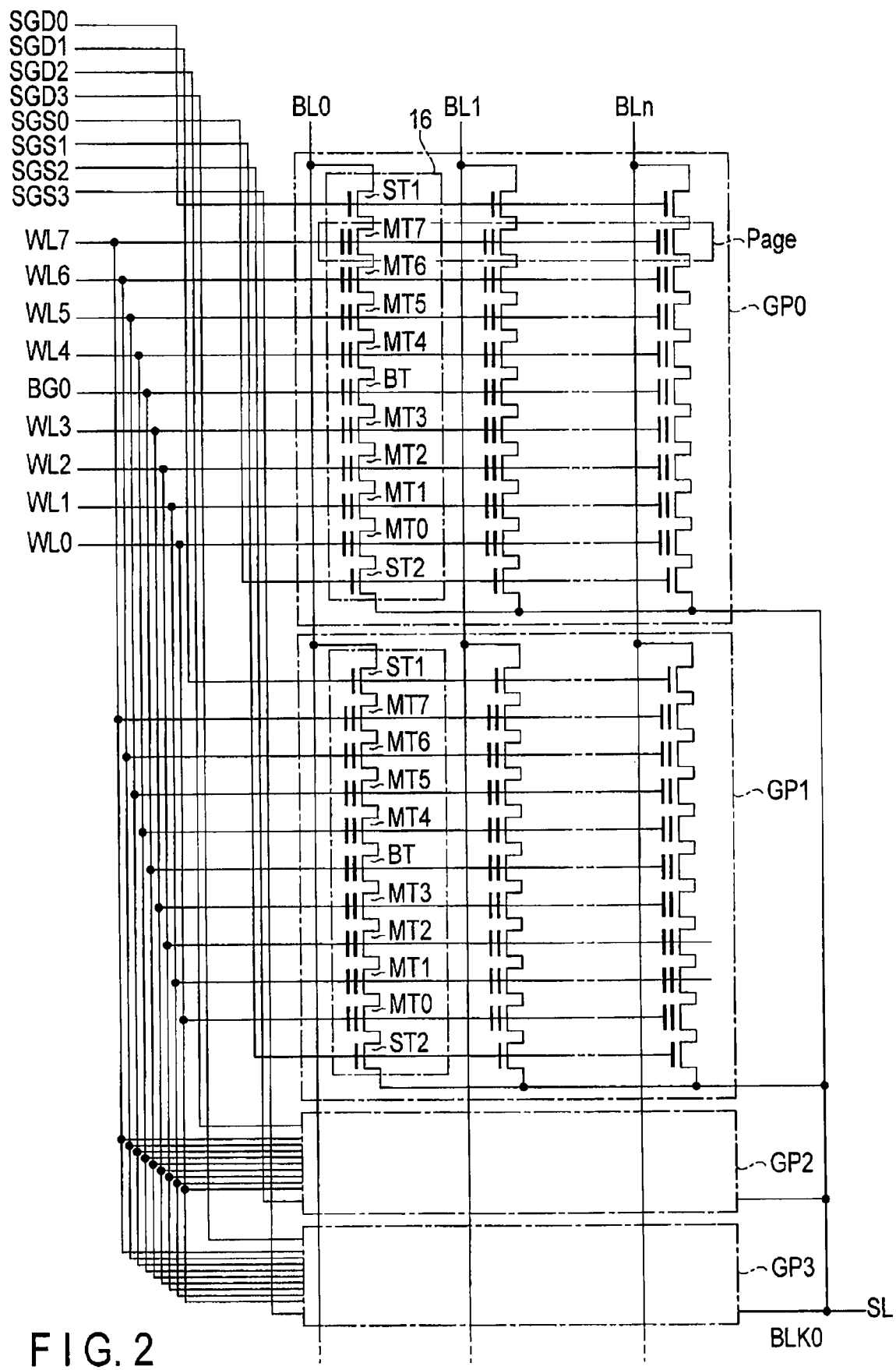

Details of the arrangement of the memory cell array 10 will be explained below. FIG. 2 is a circuit diagram of the block BLK0. The blocks BLK1 to BLK3 also have the same arrangement.

As shown in FIG. 2, the block BLK0 includes the four memory groups GP. Each memory group GP includes n (n is a natural number) NAND strings 16.

Each NAND string 16 includes, e.g., eight memory cell transistors MT (MT0 to MT7), selection transistors ST1 and ST2, and a backgate transistor BT. The memory cell transistor MT includes a stacked gate including a control gate and charge accumulation layer, and nonvolatilly holds data. Note that the number of memory cell transistors MT is not limited to eight and may also be, e.g., 16, 32, 64, or 128, i.e., the number is not limited. Similar to the memory cell transistor MT, the backgate transistor BT includes a stacked gate including a control gate and charge accumulation layer. However, the backgate transistor BT does not hold data, and functions as a mere current path in data write and erase. The memory cell transistors MT and backgate transistor BT are arranged between the selection transistors ST1 and ST2 such that their current paths are connected in series. Note that the backgate transistor BT is formed between the memory cell transistors MT3 and MT4. The current path of the memory cell transistor MT7 at one end of this series connection is connected to one end of the current path of the selection transistor ST1. The current path of the memory cell transistor MT0 at the other end of the series connection is connected to one end of the current path of the selection transistor ST2.

The gates of the selection transistors ST1 of each of the memory groups GP0 to GP3 are connected together to an associated one of select gate lines SGD0 to SGD3, and the gates of the selection transistors ST2 of each of the memory groups GP0 to GP3 are connected together to an associated one of select gate lines SGS0 to SGS3. On the other hand, the control gates of the memory cell transistors MT0 to MT7 in the same block BLK0 are connected together to word lines WL0 to WL7, respectively, and the control gates of the backgate transistors BT are connected together to a backgate line BG (BG0 to BG3 in the blocks BLK0 to BLK3, respectively).

That is, the word lines WL0 to WL7 and backgate lines BG are connected together across the plurality of memory groups GP0 to GP3 in the same block BLK0, but the select gate lines SGD and SGS are independent for each of the memory groups GP0 to GP3 even in the same block BLK0.

Also, among the NAND strings 16 arranged in a matrix in the memory cell array 10, the other-ends of the current paths of the selection transistors ST1 of the NAND strings 16 in the same row are connected together to one of bit lines BL (BL0 to BLn, n is a natural number). That is, the bit line BL connects the NAND strings 16 together across the plurality of blocks BLK. Furthermore, the other-ends of the current paths of the selection transistors ST2 are connected together to a source line SL. The source line SL connects the NAND strings 16 together across, e.g., a plurality of blocks.

As described previously, data of the memory cell transistors MT in the same block. BLK is erased at once. On the other hand, data read and write are performed for a plurality of memory cell transistors MT connected together to a given word line WL in a given memory group GP of a given block BLK. This unit is called a "page".

Next, the three-dimensionally stacked structure of the memory cell array 10 will be explained below with reference to FIGS. 3 and 4. FIGS. 3 and 4 are a perspective view and sectional view, respectively, of the memory cell array 10.

As shown in FIGS. 3 and 4, the memory cell array 10 is formed above a semiconductor substrate 20. The memory cell array 10 includes a backgate transistor layer L1, memory cell transistor layer L2, selection transistor layer L3, and interconnection layer L4 sequentially formed above the semiconductor substrate 20.

The backgate transistor layer L1 functions as the backgate transistors BT. The memory cell transistor layer L2 functions as the memory cell transistors MT0 to MT7 (NAND strings 16). The selection transistor layer L3 functions as the selection transistors ST1 and ST2. The interconnection layer L4 functions as the source line SL and bit lines BL.

The backgate transistor layer L1 includes a backgate conductive layer 21. The backgate conductive layer 21 is formed to two-dimensionally extend in the row and column directions parallel to the semiconductor substrate 20. The backgate conductive layer 21 is separated for each block BLK. The backgate conductive layer 21 is made of, e.g., polysilicon. The backgate conductive layer 21 functions as the backgate lines BG.

As shown in FIG. 4, the backgate conductive layer 21 has a backgate hole 22. The backgate hole 22 is made to scoop out the backgate conductive layer 21. The backgate hole 22 is made into an almost rectangular shape having a longitudinal direction in the column direction when viewed from the upper surface.

The memory cell transistor layer L2 is formed on the backgate conductive layer L1. The memory cell transistor layer L2 includes word line conductive layers 23a to 23d. The word line conductive layers 23a to 23d are stacked with interlayer dielectric layers (not shown) being sandwiched between them. The word line conductive layers 23a to 23d are formed into stripes extending in the row direction at a predetermined pitch in the column direction. The word line conductive layers 23a to 23d are made of, e.g., polysilicon. The word line conductive layer 23a functions as the control gates (word lines WL3 and WL4) of the memory cell transistors MT3 and MT4, the word line conductive layer 23b functions as the control gates (word lines WL2 and WL5) of the memory cell transistors MT2 and MT5, the word line conductive layer 23c functions as the control gates (word lines WL1 and WL6) of the memory cell transistors MT1 and MT6, and the word line conductive layer 23d functions as the control gates (word lines WL0 and WL7) of the memory cell transistors MT0 and MT7.

As shown in FIG. 4, the memory cell transistor layer L2 has memory holes 24. The memory holes 24 are made to extend through the word line conductive layers 23a to 23d. The memory holes 24 are made to align with the end portion of the backgate hole 22 in the column direction.

As shown in FIG. 4, the backgate transistor layer L1 and memory cell transistor layer L2 further include a block insulating layer 25a, charge accumulation layer 25b, tunnel insulating layer 25c, and semiconductor layer 26. The semiconductor layer 26 functions as the body (the back gate of each transistor) of the NAND string 16.

As shown in FIG. 4, the block insulating layer 25a is formed with a predetermined thickness on sidewalls facing the backgate hole 22 and memory holes 24. The charge accumulation layer 25b is formed with a predetermined thickness on the side surfaces of the block insulating layer 25a. The tunnel insulating layer 25c is formed with a predetermined thickness on the side surfaces of the charge accumulation layer 25b. The semiconductor layer 26 is formed in contact with the side surfaces of the tunnel insulating layer 25c. The semiconductor layer 26 is formed to fill the backgate hole 22 and memory holes 24.

The semiconductor layer 26 is formed into a U-shape when viewed in the row direction. That is, the semiconductor layer 26 includes a pair of pillar portions 26a extending in a direction perpendicular to the surface of the semiconductor substrate 20, and a connecting portion 26b connecting the lower ends of the pair of pillar portions 26a.

The block insulating layer 25a and tunnel insulating layer 25c are made of, e.g., silicon oxide ($SiO_2$). The charge accumulation layer 25b is made of, e.g., silicon nitride (SiN). The semiconductor layer 26 is made of polysilicon. The block insulating layer 25a, charge accumulation layer 25b, tunnel insulating layer 25c, and semiconductor layer 26 form MONOS transistors that function as the memory cell transistors MT.

In the arrangement of the backgate transistor layer L1, the tunnel insulating layer 25c is formed to surround the connecting portions 26b. The backgate conductive layer 21 is formed to surround the connecting portions 26b.

Also, in the arrangement of the memory cell transistor layer L2, the tunnel insulating layer 25c is formed to surround the pillar portions 26a. The charge accumulation layer 25b is formed to surround the tunnel insulating layer 25c. The block insulating layer 25a is formed to surround the charge accumulation layer 25b. The word line conductive layers 23a to 23d are formed to surround the block insulating layers 25a to 25c and pillar portions 26a.

As shown in FIGS. 3 and 4, the selection transistor layer L3 includes conductive layers 27a and 27b. The conductive layers 27a and 27b are formed into stripes extending in the row direction so as to have a predetermined pitch in the column direction. A pair of conductive layers 27a and a pair of conductive layers 27b are alternately arranged in the column direction. The conductive layer 27a is formed in an upper layer of one pillar portion 26a, and the conductive layer 27b is formed in an upper layer of the other pillar portion 26a.

The conductive layers 27a and 27b are made of polysilicon. The conductive layer 27a functions as the gate (select gate line SGS) of the selection transistor ST2. The conductive layer 27b functions as the gate (select gate line SGD) of the selection transistor ST1.

As shown in FIG. 4, the selection transistor layer L3 has holes 28a and 28b. The holes 28a and 28b respectively extend through the conductive layers 27a and 27b. Also, the holes 28a and 28b align with the memory holes 24.

As shown in FIG. 4, the selection transistor layer L3 includes gate insulating layers 29a and 29b, and semiconductor layers 30a and 30b. The gate insulating layers 29a and 29b are respectively formed on sidewalls facing the holes 28a and 28b. The semiconductor layers 30a and 30b are formed into pillars extending in the direction perpendicular to the surface of the semiconductor substrate 20, so as to come in contact with the gate insulating layers 29a and 29b, respectively.

The gate insulating layers 29a and 29b are made of, e.g., silicon oxide ($SiO_2$). The semiconductor layers 30a and 30b are made of, e.g., polysilicon.

In the arrangement of the selection transistor layer L3, the gate insulating layer 29a is formed to surround the pillar semiconductor layer 30a. The conductive layer 27a is formed to surround the gate insulating layer 29a and semiconductor layer 30a. The gate insulating layer 29b is formed to surround the pillar semiconductor layer 30b. The conductive layer 27b is formed to surround the gate insulating layer 29b and semiconductor layer 30b.

As shown in FIGS. 3 and 4, the interconnection layer L4 is formed on the selection transistor layer L3. The interconnection layer L4 includes a source line layer 31, plug layer 32, and bit line layer 33. The source line layer 31 is formed into a plate extending in the row direction. The source line layer 31 is formed in contact with the upper surfaces of the pair of semiconductor layers 27a adjacent to each other in the column direction. The plug layer 32 is formed in contact with the upper surface of the semiconductor layer 27b, so as to extend in the direction perpendicular to the surface of the semiconductor substrate 20. The bit line layer 33 is formed into stripes extending in the column direction at a predetermined pitch in the row direction. The bit line layer 33 is formed in contact with the upper surface of the plug layer 32. The source line layer 31, plug layer 32, and bit line layer 33 are made of a metal such as tungsten (W). The source line layer 31 functions as the source line SL explained with reference to FIGS. 1 and 2, and the bit line layer 33 functions as the bit lines BL.

FIG. 5 shows an equivalent circuit of the NAND string 16 shown in FIGS. 3 and 4. As shown in FIG. 5, the NAND string 16 includes the selection transistors ST1 and ST2, memory cell transistors MT0 to MT7, and backgate transistor BT. As described above, the memory cell transistors MT are connected in series between the selection transistors ST1 and ST2. The backgate transistor BT is connected in series between the memory cell transistors MT3 and MT4. In data write and read, the backgate transistor BT is kept ON.

The control gates of the memory cell transistors MT are connected to the word lines WL, and the control gate of the backgate transistor BT is connected to the backgate line BG. A set of the plurality of NAND strings 16 arranged along the row direction in FIG. 3 is equivalent to the memory group GP explained with reference to FIG. 2.

1.3 Row Decoders 11

The arrangement of the row decoders 11 will be explained below. The row decoders 11-0 to 11-3 are respectively associated with the blocks BLK0 to BLK3, in order to select or unselect the blocks BLK0 to BLK3. FIG. 6 shows the arrangement of the row decoder 11-0 and driver circuit 12. Note that the row decoders 11-1 to 11-3 also have the same arrangement as that of the row decoder 11-0.

As shown in FIG. 6, the row decoder 11 includes a block decoder 40, and high-withstand-voltage, n-channel MOS transistors 50 to 54 (50-0 to 50-7, 51-0 to 51-3, 52-0 to 52-3, 53-0 to 53-3, and 54-0 to 54-3) and 55.

1.3.1 Block Decoder 40

As shown in FIG. 6, the block decoder 40 includes an AND gate 41, a low-withstand-voltage, n-channel depletion-type MOS transistor 42, high-withstand-voltage, n-channel depletion-type MOS transistors 43 and 44, a high-withstand-voltage, p-channel MOS transistor 45, and an inverter 46.

The AND gate 41 performs an AND operation of the bits of an externally supplied block address BA. If the block address BA indicates the block BLK0 associated with the row decoder 11-0, the AND gate 41 output goes high. The transistor 42 has a current path having one end connected to the output node of the AND gate 41, and has a gate to which a signal BSTON is supplied. The transistor 43 has a current path having one end connected to the other end of the current path of the transistor 42, and the other end connected to a signal line TG, and has a gate to which the signal BSTON is supplied. The signal BSTON is a signal to be asserted (high) when receiving address information of the block decoder 40. The inverter 46 inverts the operation result from the AND gate 41, and outputs the inverted result as a signal RDECADn. The transistor 45 has a current path having one end connected to the signal line TG, and the other end connected to the back gate, and has a gate to which the signal RDECADn is supplied. The transistor 44 has a current path having one end to which a voltage VRDEC is supplied, and the other end connected to the other end of the current path of the transistor 45, and has a gate connected to the signal line TG.

In data write, read, and erase, if the block address BA matches the block BLK0, the transistors 44 and 45 are turned on to apply the voltage VRDEC (in this embodiment, "H" level) to the signal line TG. If the block address BA does not match the block BLK0, the MOS transistors 44 and 45 are turned off, and the signal line TG is set at, e.g., 0 V ("L" level).

1.3.2 Transistors 50

The transistors 50 will be explained below. The transistors 50 transfer voltages to the word lines WL of a selected block BLK. Each of the transistors 50-0 to 50-7 has a current path having one end connected to an associated one of the word lines WL0 to WL7 of the block BLK0, and the other end connected to an associated one of signal lines CG0 to CG7, and has a gate connected to the signal line TG.

Accordingly, in the row decoder 11-0 associated with the selected block BLK0, for example, the transistors 50-0 to 50-7 are turned on to connect the word lines WL0 to WL7 to the signal lines CG0 to CG7. On the other hand, in the row decoders 11-1 to 11-3 associated with the unselected blocks BLK1 to BLK3, the transistors 50-0 to 50-7 are turned off to disconnect the word lines WL0 to WL7 from the signal lines CG0 to CG7.

1.3.3 Transistors 51 and 52

The transistors 51 and 52 will be explained below. The transistors 51 and 52 transfer voltages to the select gate lines SGD. Each of the transistors 51-0 to 51-3 has a current path having one end connected to an associated one of the select gate lines SGD0 to SGD3 of the block BLK0, and the other end connected to an associated one of signal lines SGDD0 to SGDD3, and has a gate connected to the signal line TG. Each of the transistors 52-0 to 52-3 has a current path having one end connected to an associated one of the select gate lines SGD0 to SGD3 of the block BLK0, and the other end connected to a node SGD_COM, and has a gate to which the signal RDECADn is supplied. The node SGD_COM is at a voltage that turns off the selection transistor ST1, e.g., at 0 V.

Accordingly, in the row decoder 11-0 associated with the selected block BLK0, for example, the transistors 51-0 to 51-3 are turned on, and the transistors 52-0 to 52-3 are turned off. Therefore, the select gate lines SGD0 to SGD3 of the selected block BLK0 are connected to the signal lines SGDD0 to SGDD3.

On the other hand, in the row decoders 11-1 to 11-3 associated with the unselected blocks BLK1 to BLK3, the transistors 51-0 to 51-3 are turned off, and the transistors 52-0 to 52-3 are turned on. Therefore, the select gate lines SGD0 to SGD3 of the unselected blocks BLK1 to BLK3 are connected to the node SGD_COM.

1.3.4 Transistors 53 and 54

The transistors 53 and 54 transfer voltages to the select gate lines SGS. The connection and operation are equivalent to those of the transistors 51 and 52 with the select gate lines SGD replaced by the select gate lines SGS.

That is, in the row decoder 11-0 associated with the selected block BLK0, the transistors 53-0 to 53-3 are turned on, and the transistors 54-0 to 54-3 are turned off. On the other hand, in the row decoders 11-1 to 11-3 associated with the unselected blocks BLK1 to BLK3, the transistors 53-0 to 53-3 are turned off, and the transistors 54-0 to 54-3 are turned on.

1.3.5 Transistor 55

The transistor 55 will be explained below. The transistor 55 transfers voltages to the backgate line BG. The transistor 55 has a current path having one end connected to the backgate line BG0 of the block BLK0, and the other end connected to a signal line BGD, and has a gate connected to the signal line TG.

Accordingly, the transistor 55 is turned on in the row decoder 11-0 associated with the selected block BLK0, and turned off in the row decoders 11-1 to 11-3 associated with the unselected blocks BLK1 to BLK3.

1.4 Driver Circuit 12

The arrangement of the driver circuit 12 will now be explained. The driver circuit 12 transfers voltages necessary for data write, read, and erase to the signal lines CG0 to CG7, SGDD0 to SGDD3, SGSD0 to SGSD3, and BGD.

As shown in FIG. 6, the driver circuit 12 includes CG drivers 60 (60-0 to 60-7), SGD drivers 61 (61-0 to 61-3), SGS drivers 62 (62-0 to 62-3), a BG driver 64, and a voltage driver 63.

1.4.1 Voltage Driver 63

First, the voltage driver 63 will be explained. The voltage driver 63 generates voltages to be used by the block decoder 40 and CG drivers 60.

FIG. 7 is a circuit diagram of the voltage driver 63. As shown in FIG. 7, the voltage driver 63 includes first, second, and third drivers 70, 71, and 72 for generating voltages VBST, VRDEC, and VCGSEL, respectively.

The first driver 70 includes high-withstand-voltage, n-channel MOS transistors 73 and 74, and local pump circuits L/P1 and L/P2.

The current path of the transistor 73 has one end to which a voltage VPGMH is applied in programming, and which is connected to the local pump circuit L/P1. The voltage VPGMH is applied by the voltage generator 14, and higher than a voltage VPGM. VPGM is a high voltage to be applied to a selected word line in programming. Also, the local pump circuit L/P1 applies a voltage to the gate of the transistor 73 in programming.

The current path of the transistor 74 has one end to which a voltage VREADH is applied in data read, and which is connected to the local pump circuit L/P2. The voltage VREADH is applied by the voltage generator 14, and higher than a voltage VREAD. VREAD is a voltage that is applied to an unselected word line in data read, and turns on the memory cell transistor MT regardless of held data. Also, the local pump circuit L/P2 applies a voltage to the gate of the transistor 74 in data read. The other-ends of the current paths of the transistors 73 and 74 are connected together, and the voltage of this connection node is output as the voltage VBST.

In the first decoder 70 in the above-mentioned arrangement, the transistor 73 is turned on to output voltage VBST=VPGMH in programming. In data read, the transistor 74 is turned on to output voltage VBST=VREADH.

The second driver 71 will be explained below. The second driver 71 includes high-withstand-voltage, n-channel MOS transistors 75 and 76, and local pump circuits L/P3 and L/P4.

The current path of the transistor 75 has one end to which the voltage VPGMH is applied in programming, and which is connected to the local pump circuit L/P3. The local pump circuit L/P3 applies a voltage to the gate of the transistor 75 in programming.

The current path of the transistor 76 has one end to which the voltage VREADH is applied in data read, and which is connected to the local pump circuit L/P4. The local pump circuit L/P4 applies a voltage to the gate of the transistor 76 in data read. The other-ends of the current paths of the transistors 75 and 76 are connected together, and the voltage of this connection node is output as the voltage VRDEC.

In the second decoder 71 in the aforementioned arrangement, the transistor 75 is turned on to output voltage VRDEC=VPGMH in programming. In data read, the transistor 76 is turned on to output voltage VRDEC=VREADH.

The third driver 72 will be explained below. The third driver 72 includes high-withstand-voltage, n-channel MOS transistors 77 to 80, a high-withstand-voltage, n-channel depletion-type MOS transistor 81, a resistance element 82, local pump circuits L/P5 and L/P6, and level shifters L/S1 and L/S2.

The voltage VPGM is applied to one end of the current path of the transistor 77, and this end is connected to the local pump circuit L/P5. The local pump circuit L/P5 applies a voltage to the gate of the transistor 77.

The current path of the transistor 81 has one end connected to the other end of the current path of the transistor 77, and the other end connected to one end of the current path of the transistor 78. An output from the level shifter L/S1 is applied to the gates of the transistors 78 and 81. In programming, the level shifter L/S1 receives the voltage VBST from the first driver 70, shifts the level of the voltage VBST, and outputs the level-shifted voltage.

The transistor 79 has a current path having one end to which a voltage VPASS is applied, and which is connected to the local pump circuit L/P6, and has a gate to which an output from the local pump circuit L/P6 is applied. The voltage VPASS (and VPASSA to be described later) is a voltage that is applied to an unselected word line of an unselected block in programming, and turns on the memory cell transistor MT regardless of held data.

The transistor 80 has a current path having one end to which a voltage VCGR is applied, and has a gate to which an output from the level shifter L/S2 is applied. In data read, the level shifter L/S2 receives the voltage VREADH from the voltage generator 14, shifts the level of the voltage VREADH, and outputs the level-shifted voltage.

The resistance element 82 has one terminal connected to one end of the current path of the transistor 77, and the other terminal connected to the other end of the current path of the transistor 77.

The other-ends of the current paths of the transistors 78 to 80 are connected together. This connection node is the output node of the third driver 72, and outputs the voltage VCGSEL.

Note that a charge pump circuit in the voltage generator 14 generates the voltages VPGMH, VREADH, VPASS, and VCGR described above and a voltage VPASSA to be described later. Note also that the voltages VPGM and VREAD are generated by, e.g., stepping down the voltages VPGMH and VREADH. FIG. 8 shows an arrangement example for generating the voltages VPGMH and VPGM in the voltage generator 14.

As shown in FIG. 8, the voltage generator 14 includes a charge pump circuit 90, limiter circuit 91, and high-withstand-voltage, n-channel MOS transistor 92. The charge pump circuit 90 generates the voltage VPGMH, and outputs the voltage VPGMH to a node N1. The transistor 92 is diode-connected between the node N1 and a node N2. The potential of the node N2 is output as VPGM. Accordingly, VPGMH=VPGM+Vth where Vth is the threshold voltage of the transistor 92. The limiter circuit 91 monitors the voltage VPGM, and controls the charge pump circuit 90 to give VPGM a desired value. This similarly applies to VREADH and VREAD.

1.4.2 CG Drivers 60

The CG drivers 60 will be explained below. The CG drivers 60-0 to 60-7 each transfer necessary voltages to an associated one of the signal lines CG0 to CG7 (word lines WL0 to WL7). FIG. 9 is a circuit diagram of the CG driver 60-0. The CG drivers 60-1 to 60-7 also have the same arrangement.

As shown in FIG. 9, the CG driver 60 includes high-withstand-voltage, n-channel MOS transistors 100 to 104, local pump circuits L/P6 to L/P8, and level shifters L/S3 and L/S4.

The transistor 100 has a current path having one end to which the voltage VCGSEL is applied, and the other end connected to an associated signal line CG (CGi in a CG driver 60-i where i is one of 0 to 7), and has a gate to which an output from the level shifter L/S3 is applied. In programming or data read, the level shifter L/S3 receives the voltage VBST from the voltage driver 63, shifts the level of the voltage VBST, and outputs the level-shifted voltage. The transistor 101 has a current path having one end to which the voltage VPASS is applied and which is connected to the local pump circuit L/P6, and the other end connected to the associated signal line CG, and has a gate to which an output from the local pump circuit L/P6 is applied. The transistor 102 has a current path having one end to which the voltage VPASSA is applied and which is connected to the local pump circuit L/P7, and the other end connected to the associated signal line CG, and has a gate to which an output from the local pump circuit L/P7 is applied. The transistor 103 has a current path having one end to which the voltage VREAD is applied and which is connected to the local pump circuit L/P8, and the other end connected to the associated signal line CG, and has a gate to which an output from the local pump circuit L/P8 is applied. The transistor 104 has a current path having one end to which a voltage VISO is applied, and the other end connected to the associated signal line CG, and has a gate to which an output from the level shifter L/S4 is applied. In programming, the level shifter L/S4 receives the voltage VREADH, shifts the level of the voltage VREADH, and outputs the level-shifted voltage. The voltage VISO is a voltage for turning off the memory cell transistor MT regardless of held data.

In the CG driver 60 associated with a selected word line WL in the aforementioned arrangement, the transistor 100 is turned on to transfer the voltage VPGM to the associated signal line CG in programming. In data read, the transistor 100 is turned on to transfer the voltage VCGR to the associated signal line CG. These voltages are transferred to the selected word line WL via the current path of the transistor 50 in the row decoder 11.

In the CG driver 60 associated with an unselected word line, the transistor 100 and/or 101, transistor 102, or transistor 104 is turned on in programming. The CG driver 60 in which the transistor 100 and/or 101 is turned on transfers the voltage VPASS to the associated signal line CG. The CG driver 60 in which the transistor 102 is turned on transfers the voltage VPASSA to the associated signal line CG. The CG driver 60 in which the transistor 104 is turned on transfers the voltage VISO to the associated signal line CG. In data read, the transistor 103 is turned to transfer the voltage VREAD to the associated signal line CG. These voltages are transferred to the unselected word line WL via the current path of the transistor 50 in the row decoder 11.

More specifically, when performing programming, in the CG driver 60 associated with an unselected word line adjacent to a selected word line, the transistor 102 is turned on to transfer VPASSA to the unselected word line. If the unselected word line is not adjacent to the selected word line WL, the transistor 100 and/or 101 or 104 is turned on to transfer VPASS or VISO to the unselected word line;

Note that the blocks BLK may also share CG0 to CG7. That is, the four word lines WL0 belonging to the four blocks BLK0 to BLK3 may also be driven by the same CG driver 60-0 via the transistors 50-0 of the associated row decoders 11-0 to 11-3. This similarly applies to the signal lines CG1 to CG7.

1.4.3 SGD Drivers 61

The SGD drivers 61 will be explained below. The SGD drivers 61-0 to 61-3 transfer necessary voltages to the signal lines SGDD0 to SGDD3 (select gate lines SGD0 to SGD3). FIG. 10 is a circuit diagram of the SGD driver 61-0. The SGD drivers 61-1 to 61-3 also have the same arrangement.

As shown in FIG. 10, the SGD driver 61 includes a high-withstand-voltage, n-channel MOS transistor 110 and level shifter L/S5. The transistor 110 has a current path having one end to which a voltage VSGD is applied, and the other end connected to an associated signal line SGDD (SGDDj in an SGD driver 61-j where j is one of 0 to 3), and has a gate to which an output from the level shifter L/S5 is applied. In programming or data read, the level shifter L/S5 receives the voltage VREADH, shifts the level of the voltage VREADH, and outputs the level-shifted voltage.

In the above-described arrangement, in the SGD driver 61 corresponding to the select gate line SGD connected to the NAND string 16 including a selected word line, the transistor 110 is turned on to transfer the voltage VSGD to the associated signal line SGDD. The voltage VSGD is a voltage for turning on the selection transistor ST1 in data read (in data write, this voltage turns on the transistor in accordance with write data). In other SGD drivers 61, a voltage of, e.g., 0 V is transferred to the signal lines SGDD through given paths (not shown).

1.4.4 SGS Drivers 62

The SGS drivers 62 will be explained below. The SGS drivers 62-0 to 62-3 transfer necessary voltages to the signal lines SGSD0 to SGSD3 (select gate lines SGS0 to SGS3). FIG. 11 is a circuit diagram of the SGS driver 62-0. The SGS drivers 62-1 to 62-3 also have the same arrangement.

As shown in FIG. 11, the SGS driver 62 includes a high-withstand-voltage, n-channel MOS transistor 120 and level shifter L/S6. The transistor 120 has a current path having one end to which the voltage VSGS is applied, and the other end connected to an associated signal line SGSD (SGSDk in an SGS driver 62-*k* where k is one of 0 to 3), and has a gate to which an output from the level shifter L/S6 is applied. In data read, the level shifter L/S6 receives the voltage VREADH, shifts the level of the voltage VREADH, and outputs the level-shifted voltage.

In data read, in the SGS driver 62 associated with the select gate line SGS connected to the NAND string 16 including a selected word line, the transistor 120 is turned on to transfer a voltage VSGS to the associated signal line SGSD. The voltage VSGS is a voltage for turning on the selection transistor ST2. In other SGS drivers 62, a voltage of, e.g., 0 V is transferred to the signal lines SGSD through given paths (not shown). This similarly applies to data write.

1.4.5 BG Driver 64

The BG driver 64 will now be explained. The BG driver 64 is equivalent to, e.g., an arrangement obtained by omitting the VCGSEL transfer path from the CG driver 60 explained with reference to FIG. 9. That is, in data write, the transistors 101, 102, and 104 transfer VPASS, VPASSA, or VISO to the backgate line BG. In data read, the transistor 1.03 transfers VREAD to the backgate line BG.

More specifically, if the backgate line BG is adjacent to a selected word line WL in data write, the transistor 102 is turned on to transfer VPASSA to the backgate line BG. If the backgate line BG is not adjacent to the selected word line WL, the transistor 101 or 104 is turned on to transfer VPASS or VISO to the backgate line BG.

2. Data Write Operation 2.1 Write Process

The write operation of the NAND flash memory having the above arrangement will be explained below with reference to FIG. 12. FIG. 12 is a flowchart of the write operation. A write sequence according to this flowchart is executed under the control of the control circuit 15 having received an external write command.

As described previously, data write is performed at once for all memory cell transistors MT (one page) connected to the same word line in a given memory group GP. In this specification, an operation of injecting electric charge into the charge accumulation layer by producing a potential difference between the control gate and channel and raising the threshold value of the memory cell transistor MT by that will be referred to as "programming". By executing programming a plurality of times, the threshold value of the memory cell transistor MT is raised to a desired value, and a data write operation is performed.

First, the control circuit 15 receives a write command and performs set-up (step S10). That is, the control circuit 15 instructs the voltage generator 14 to activate the charge pump circuit. In response to this instruction, the voltage generator 14 generates voltages VPGMH, VPGM, VPGM, VPASS, and VPASSA (and VISO).

Then, the control circuit 15 transfers the write data to the sense amplifier 13, and the sense amplifier 13 transfers the write data to each bit line BL (step S11). In other words, the sense amplifier 13 applies a voltage corresponding to the write data to each bit line BL.

Subsequently, programming is performed (step S12). In the following description, details of step S12 will be explained by taking, as an example, an operation when the word line WL4 of the memory group GP0 of the block BLK0 is selected.

First, the CG drivers 60 will be explained. In the CG driver 60-4 associated with the selected word line WL4, the transistor 100 is turned on. Accordingly, VCGSEL=VPGM is transferred to the signal line CG4. In the CG driver 60-5 associated with the unselected word line WL5 adjacent to the selected word line WL4, the transistor 102 is turned on. Therefore, VPASSA is transferred to the signal line CG5. In the CG driver 60-1 associated with the unselected word line WL1, the transistor 104 is turned on. Consequently, VCGSEL=VISO is transferred to the signal line CG1. In the CG drivers 60-0, 60-2, 60-3, 60-6, and 60-7 associated with the unselected word lines WL0, WL2, WL3, WL6, and WL7, the transistors 101 (or/and 100) are turned on. Accordingly, VPASS is transferred to the signal lines CG0, CG2, CG3, CG6, and CG7.

Next, the BG driver 64 will be explained. The selected word line WL4 is adjacent to the backgate line BG. Therefore, the transistor 102 is turned on in the BG driver 64. Consequently, VPASSA is transferred to the signal line BGD.

The SGD drivers 61 and SGS drivers 62 will be explained below. The transistor 110 is turned on in the SGD driver 61-0 associated with the select gate line SGD0 of the memory group GP0 including the selected word line WL4. Accordingly, VSGD is transferred to the signal line SGDD0. In the SGD drivers 61-1 to 61-3, the transistors 110 are turned off, and 0 V is transferred to the signal lines SGDD1 to SGDD3 (these signal lines may also be made to float electrically).

The row decoders 11 will be explained below. In the row decoder 11-0, the output from the AND gate 41 of the block decoder 40 goes high. Accordingly, voltage VRDEC=VPGMH is transferred to the signal line TG, and the transistors 50, 51, 53, and 55 are turned on. On the other hand, the transistors 52 and 54 are turned off. Consequently, the voltages of the CG drivers 60-0 to 60-7, SGD drivers 61-0 to 61-3, SGS drivers 62-0 to 62-3, and BG driver 64 are transferred to the word lines WL0 to WL7, select gate lines SGD0 to SGD3, select gate lines SGS0 to SGS3, and backgate line BG0 of the block BLK0.

In each of the row decoders 11-1 to 11-3, the output from the AND gate 41 of the block decoder 40 goes low. Therefore, the signal line TG remains at, e.g., 0 V ("L" level). Therefore, the transistors 50, 51, 53, and 55 are turned off. On the other hand, the transistors 52 and 54 are turned on. Consequently, the word lines WL0 to WL7 and backgate lines BG1 to BG3 of the blocks BLK1 to BLK3 are made to float electrically. In addition, the transistors 52-0 to 52-3 and 54-0 to 54-3 connect the select gate lines SGD0 to SGD3 and SGS0 to SGS3 of the blocks BLK1 to BLK3 to the nodes SGD_COM and SGS_COM (e.g., 0 V).

As a result, voltages as shown in FIG. 13 are applied to the NAND strings 16 in the memory group GP0 of the block BLK0. FIG. 13 is a circuit diagram of the NAND string 16 in the memory group GP0.

As shown in FIG. 13, the voltage VPGM is applied to the selected word line WL4. The voltage VPASSA is applied to the unselected word line WL5 and backgate line BG0 adjacent to the selected word line WL4. The voltage VISO is applied to the unselected word line WL1. The voltage VPASS is applied to the unselected word lines WL0, WL2, WL3, WL6, and WL7. The voltage VSGD is applied to the select gate line SGD, and 0 V is applied to the select gate line SGS. Accordingly, the memory cell transistors MT0 and MT2 to MT7 and backgate transistor BT are turned on. The selection transistor ST1 is turned on or off in accordance with the write data. Hatched portions shown in FIG. 13 indicate the way the channel is formed when the selection transistor ST1 is also turned on. Since this channel is formed, the write data transferred to the bit line BL is transferred to the memory cell transistor MT4 connected to the selected word line WL4, and the data is programmed in the memory cell transistor MT4.

In each of the memory groups GP1 to GP3 of the block BLK0, 0 V is applied to the select gate line SGD0, so the selection transistor ST1 is turned off. Therefore, no data is programmed.

In each of the unselected blocks BLK1 to BLK3, all the word lines WL0 to WL7 are made to float (or set at 0 V), so no data is programmed either.

After the above-mentioned programming is performed in step S12, the control circuit 15 refers to the result of verification. Verification is the process of reading programmed data from the memory cell transistor MT, and determining whether the desired data has been written. If the desired data has not been written yet, the programming in step S12 is repeated. In the following description, a state in which it is determined that the threshold voltage of the memory cell transistor MT has sufficiently risen and desired data has been written will be called "the cell has passed verify", and a state in which it is determined that the rise in threshold voltage is insufficient and data write has not been completed yet will be called "the cell has missed verify".

If the aforementioned programming is the first programming of the write operation for the page, no verification has been performed yet, so the cell misses verify (NO in step S13). Accordingly, the control circuit 15 executes verification (step S14).

After the completion of verification, the control circuit 15 instructs the voltage generator 14 to step up the voltage VPGM. In response to this instruction, the voltage generator 14 sets voltage VPGM=(VPGM+ΔVPGM). That is, the voltage generator 14 steps up the voltage VPGM by ΔVPGM (step S15).

Subsequently, the control circuit 15 instructs the voltage generator 14 to step down the voltage VPASSA. In response to this instruction, the voltage generator 14 sets voltage VPASSA=(VPASSA−ΔVPASSA). That is, the voltage generator 14 steps down the voltage VPASSA by ΔVPASSA (step S16).

After that, the process returns to step S11, and programming is executed again. If all selected cells have passed verify after the repetition of the above-mentioned programming (YES in step S13), data write is complete, and the control circuit 15 performs recovery (step S17). That is, the control circuit 15 performs processing, for example, deactivates the charge pump circuit of the voltage generator 14.

2.2 Voltages VPGM, VPASSA, and VPASS

Changes in voltages VPGM, VPASSA, and VPASS with time in the above-described write operation will be explained again with reference to FIG. 14. FIG. 14 is a timing chart of voltages VPGM, VPASSA, and VPASS.

As shown in FIG. 14, voltage VPGM is stepped up by ΔVPGM whenever programming is repeated. By contrast, voltage VPASSA is stepped down by ΔVPASSA whenever programming is repeated. Voltage VPASS is constant. Note that VPGM is always higher than VPASS and VPASSA. Note also that the initial value of VPASSA may be the same as or different from that of VPASS.

3. Effects of This Embodiment

The arrangement according to this embodiment can improve the operation reliability of a NAND flash memory. This effect will be explained below.

FIG. 15 is an enlarged view of memory cell transistors MTi and MT(i+1), and exemplarily shows electric fields when programming data in the memory cell transistor MTi.

In a three-dimensionally stacked NAND flash memory as shown in FIG. 15, an insulating film (for example, an SiN film) functioning as a charge accumulation layer 45$b$ is formed on the entire surface of a semiconductor layer 46 (a channel region) formed into a pillar shape, along the periphery of the semiconductor layer 46. That is, the charge accumulation layers 45$b$ of adjacent memory cell transistors MT are connected to each other. In other words, the charge accumulation layer 45$b$ exists in a region between adjacent memory cell transistors MT as well.

When performing programming in this embodiment having this arrangement, the high voltage VPGM is applied to a selected word line WLi, and the intermediate voltage VPASSA is applied to an unselected word line WL(i+1) (and/or WL(i−1)). The intermediate voltage VPASSA is stepped down whenever programming is repeated.

Consequently, as shown in FIG. 15, a composite electric field of an electric field due to the voltage VPGM and an electric field due to the voltage VPASSA is generated between the word lines WLi and WL(i+1), but the step-up amount of VPGM is canceled to some extent by the step-down amount of VPASSA.

That is, an excessive increase in composite electric field can be suppressed. This makes it possible to prevent electric charge from being trapped in the charge accumulation layer 45$b$ between adjacent word lines, and concentrate electric charge to be trapped to the charge accumulation layer 45$b$ of a selected memory cell.

More specifically, the composite electric field is represented by $(\alpha \times VPGM)+(\beta \times VPASSA)$. Note that α and β are the contribution ratios of VPGM and VPASSA. If VPASSA is not stepped down but is constant, the trap amount of electric charge is given by $\alpha \times \Delta V$ where ΔV is the step-up amount. That is, in this case, the step-up amount of VPGM directly contributes to the trap amount, so a large amount of electric charge is trapped between adjacent word lines.

When VPASSA is stepped down as in this embodiment, however, the electric charge trap amount due to the composite electric field is determined by $(\alpha-\beta) \times \Delta V$ (assuming that ΔV: step-up amount=step-down amount). That is, the influence can be reduced by $\beta \cdot \Delta V$ by stepping down VPASSA.

Especially when the charge accumulation layers are connected between memory cell transistors, electric charge readily moves to an adjacent memory cell transistor, and this may worsen the retention characteristic. In this embodiment, however, charge injection can be localized in a given place.

This makes it possible to prevent deterioration of the retention characteristic, and improve the operational reliability of the NAND flash memory.

Also, in the three-dimensionally stacked NAND flash memory, very many interconnections (word lines and select gate lines) are extracted to a narrow pitch of one NAND string. This extremely increases the area of the row decoders in order to independently control these interconnections for each NAND string (i.e., each memory group).

In this embodiment, therefore, a plurality of NAND strings (memory groups) share the word lines WL (see FIG. 2). As described earlier, the unit of this sharing is a block. The selectivity of each NAND string in a block is secured by independently controlling the select gate lines SGD and SGS for each NAND string. This makes it possible to decrease the size of the row decoders 11.

[Second Embodiment]

A semiconductor memory device according to the second embodiment will be explained below. In this embodiment, step-down of a voltage VPASSA is started midway through programming in the first embodiment. Only the differences from the first embodiment will be explained below.

1. Data Write Operation 1.1 Write Process

FIG. 16 is a flowchart of writing to a NAND flash memory 1 according to this embodiment. As shown in FIG. 16, steps S10 to S15 are the same as those of the first embodiment. In step S20, a control circuit 15 determines whether a predetermined condition of this programming operation is met. Practical examples of this condition will be described later. If the condition is met (YES in step S20), the control circuit 15 instructs a voltage generator 14 to step down VPASSA (step S16). This operation is the same as that of the first embodiment. On the other hand, if the condition is not met (NO in step S20), the control circuit 15 omits the processing in step S16. That is, VPASSA is not stepped down, and VPASSA used in immediately preceding programming is used in next programming as well.

1.2 Voltages VPGM, VPASSA, and VPASS

FIG. 17 is a timing chart of a voltage VPGM, the voltage VPASSA; and a voltage VPASS in this embodiment.

Unlike in FIG. 14 explained in the first embodiment, the voltage VPASSA is kept constant like VPASS to the middle of the write operation. When the predetermined condition is met midway through the write operation, step-down of VPASSA is started.

1.3 Practical Examples of Predetermined Condition

Practical examples of the predetermined condition in step S20 will be explained below. Examples of the condition are as follows.

Number of Times of Programming

In step S20, the control circuit 15 may also determine whether the number of times of programming has reached a predetermined number Nth1 (FIG. 17). If YES in step S20, step-down is started. In this case, the control circuit 15 holds data concerning the predetermined number Nth1 in, for example, an internal register. It is also possible to perform determination based on the time elapsed from the start of programming, instead of the number of times of programming.

Magnitude of VPGM

In step S20, the control circuit 15 may also determine whether VPGM has reached a predetermined threshold value VPGMth1 (see FIG. 17). If YES in step S20, step-down is started. In this case, the control circuit 15 holds data pertaining to the predetermined threshold value VPGMth1 in, e.g., an internal register.

Write Data

If the memory cell transistor MT can hold data having two or more bits, step-down of VPASSA may be started in accordance with a level as a write target. For example, VPASSA may be stepped down only when programming data of the highest threshold level.

FIG. 18 shows a threshold distribution which the memory cell transistor MT capable of holding 2-bit data can take. As shown in FIG. 18, the threshold voltage of the memory cell transistor MT can take one of four levels, i.e., levels "0" to "3", in accordance with write data ("0" is an erased state).

In this case, verification in step S13 is performed for each level. When stepping down VPASSA only when programming data of the highest threshold level, step-down of VPASSA is started if the cell passes verify for level "2". That is, VPASSA is /stepped down while the threshold voltage of the memory cell transistor MT is changed from level "2" to level "3".

It is, of course, also possible to step down VPASSA not only when programming data of the highest threshold level, but also when programming data of an arbitrary level. This similarly applies when the memory cell transistor MT can hold data having three or more bits.

2. Effect of This Embodiment

As described above, the arrangement according to the second embodiment can prevent an excessive decrease in VPASSA in the aforementioned first embodiment. That is, it is possible to prevent an excessive increase in potential difference between a selected word line WLi and unselected word lines WL(i+1) and WL(i−1) adjacent to the selected word line WLi.

[Third Embodiment]

A semiconductor memory device according to the third embodiment will be explained below. In this embodiment, step-down of a voltage VPASSA is stopped midway through programming in the above-mentioned first embodiment. Only the differences from the first embodiment will be explained below.

1. Data Write Operation 1.1 Write Process

FIG. 19 is a flowchart of writing to a NAND flash memory according to this embodiment. As shown in FIG. 19, in step S30 after steps S10 to S15, a control circuit 15 determines whether a predetermined condition of this programming operation is met. Practical examples of this condition will be described later. If the condition is not met (NO in step S30), the control circuit 15 instructs a voltage generator 14 to step down VPASSA (step S16). On the other hand, if the condition is met (YES in step S30), the control circuit 15 omits the processing in step S16.

1.2 Voltages VPGM, VPASSA, and VPASS

FIG. 20 is a timing chart of a voltage VPGM, the voltage VPASSA, and a voltage VPASS in this embodiment.

As shown in FIG. 20, in contrast to FIG. 17 explained in the second embodiment, the voltage VPASSA is stepped down to the middle of the write operation. If the predetermined condition is met midway through the write operation, step-down of VPASSA is stopped, and VPASSA is kept constant.

1.3 Practical Examples of Predetermined Condition

Practical examples of the predetermined condition in step S30 will be explained below. Examples of the condition are as follows.

Number of Times of Programming

As in the second embodiment, the control circuit 15 may also determine in step S30 whether the number of times of programming has reached a predetermined number Nth2 (FIG. 20). If YES in step S30, step-down is stopped. It is also possible to perform determination based on the time elapsed from the start of programming, instead of the number of times of programming. Nth2 can be the same as or different from Nth1 in the second embodiment.

Magnitude of VPGM

As in the second embodiment, the control circuit 15 may also determine in step S30 whether VPGM has reached a predetermined threshold value VPGMth2 (see FIG. 20). If YES in step S30, step-down is stopped. VPGMth2 can be the same as or different from VPGMth1 in the second embodiment.

Write Data

As in the second embodiment, the control circuit may also determine in step S30 whether the write level has reached a predetermined level. If YES in step S30, step-down is stopped.

Magnitude of VPASSA

The control circuit 15 may also monitor the magnitude of VPASSA that is stepped down whenever programming is performed. In step S30, the control circuit 15 may also determine whether VPASSA has reached a predetermined threshold value VPASSAth. If YES in step S30, step-down is stopped. Accordingly, VPASSAth can also be regarded as the lower limit of VPASSA.

2. Effect of This Embodiment

As described above, the arrangement according to the third embodiment can also achieve the same effect as that of the second embodiment.

[Fourth Embodiment]

A semiconductor memory device according to the fourth embodiment will be explained below. This embodiment is a combination of the above-mentioned second and third embodiments.

1. Data Write Operation 1.1 Write Process

FIG. 21 is a flowchart of the write operation of a NAND flash memory according to this embodiment. As shown in FIG. 21, after steps S10 to S15, a control circuit 15 executes the processing in step S20 to determine whether a VPASSA step-down start condition is met. If the condition is not met (NO in step S20), VPASSA is not stepped down but kept constant.

If the condition is met (YES in step S20), the control circuit 15 executes the processing in step S30 to determine whether a VPASSA step-down stop condition is met. If the condition is met (YES in step S30), VPASSA is not stepped down but kept constant. If the condition is not met (NO in step S30), VPASSA is stepped down (step S16).

1.2 Voltages VPGM, VPASSA, and VPASS

FIG. 22 is a timing chart of a voltage VPGM, the voltage VPASSA, and a voltage VPASS in this embodiment.

As shown in FIG. 22, the voltage VPASSA is stepped down from the middle of the write operation, and kept constant after that. In this embodiment, Nth1<Nth2 or VPGMth1<VPGMth2 naturally holds.

2. Effect of This Embodiment

As described above, this embodiment can step down VPASSA for only a desired period during the write operation.

[Modifications]

As described above, the semiconductor memory device 1 according to the embodiment includes the memory cells MT, the plurality of word lines WL, the diver circuit 12, and the control circuit 15. The memory cells MT are stacked above the semiconductor substrate 20, include current paths connected in series, and include the charge accumulation layer 25b and control gates 23a to 23d. The word lines WL are coupled to the control gates. The driver circuit 12 repeats the programming operation to write data in a memory cell MT coupled to a selected word line (WL4 in FIG. 13). In the programming operation, the first voltage (VPGM in FIG. 13) is applied to the selected word line, the second voltage (VPASSA in FIG. 13) to first unselected word lines (WL3, WL5 in FIG. 13), and the third voltage (VPASS, VISO in FIG. 13) to second unselected word lines (WL0-2, WL6-7 in FIG. 13). During repeating the programming operation, the control circuit 15 steps up the first voltage (VPGM in FIG. 14), and steps down the second voltage (VPASSA in FIG. 14).

This makes it possible to prevent electric charge from being trapped in the charge accumulation layer between the selected word line and unselected word line. Consequently, it is possible to improve the data retention characteristic of the memory cell, and improve the operational reliability of the semiconductor memory device.

Note that the embodiments are not limited to the forms explained above, and various modifications can be made. For example, in the above-mentioned embodiments, the selected word line WLi is adjacent to an unselected word line and the backgate line BG. However, the present embodiments are also applicable when two unselected word lines WL(i+1) and WL(i−1) are adjacent to the selected word line WLi. In this case, VPASSA may be applied to both the unselected word lines WL(i+1) and WL(i−1). It is also possible to apply VPASSA to only one of the word lines WL(i+1) and WL(I−1), and apply VPASS to the other. Furthermore, VPASSA can also be applied not only to the unselected word lines WL(i+1) and WL(i−1) adjacent to the selected word line WLi, but also to a plurality of unselected word lines close to the selected word line WLi. More specifically, VPASSA can also be applied to, e.g., unselected word lines WL(i+2) and WL(i−2). When the selected word line WLi is adjacent to an unselected word line and the backgate line BG, it is possible to apply VPASSA to only the unselected word line, and apply VPASS to the backgate lien BG.

Also, the conditions in steps S20 and S30 explained in the second and third embodiments are not limited to those explained above, and can appropriately be set. For example, step-down may also be performed for only the last programming in the write operation. Furthermore, the control circuit 15 can have a plurality of conditions, and use a proper condition in accordance with the operating environment or the like. For example, in the second embodiment, the control circuit 15 can have a plurality of values as Nth1 (and/or VPGMth1), and selectively use a proper value. This similarly applies to the third and fourth embodiments.

Although VPASSA is stepped down a plurality of number of times in the above-mentioned embodiments, VPASSA may also be stepped down only once. FIG. 23 shows VPASSA in this case. As shown in FIG. 23, VPASSA may also be stepped down only once when a predetermined condition is met. In this case, VPASSA takes two values, i.e., VPASSA1 and VPASSA2.

Furthermore, VPASS may also be stepped up like VPGM as shown in FIG. 24. In this case, VPASS may be stepped up from the middle of the write operation, and/or step-up of VPASS can be stopped midway through the write operation. For example, when VPASSA becomes a given threshold or less, the step-up of VPASS to an unselected word line adjacent to a word line to which VPASSA is applied may be stopped. The relationship between VPGM, VPASSA, and VPASS can appropriately be set. Although the voltage VISO described with reference to FIG. 13 generally has a fixed value (e.g., 0 V), it may also be stepped up as needed.

The memory cell array shown in FIG. 2 can also have an arrangement as shown in FIG. 25. FIG. 25 is a circuit diagram of the block BLK0, and the blocks BLK1 to BLK3 can have the same arrangement. As shown in FIG. 25, the word lines WL0 to WL3, backgate line BG, even-numbered select gate lines SGD0 and SGD2, and odd-numbered select gate lines SGS1 and SGS3 are extracted to one side of the memory cell array 10. On the other hand, the word lines WL4 to WL7, even-numbered select gate lines SGS0 and SGS2, and odd-numbered select gate lines SGD1 and SGD3 are extracted to the other side of the memory cell array 10, which is opposite to the above-mentioned one side. An arrangement like this is also possible.

In this arrangement, it is possible to divide the row decoder 11 into two row decoders, and arrange them such that they oppose each other with the memory cell array 10 being sandwiched between them. In this arrangement, one row decoder can select the select gate lines SGD0, SGD2, SGS1, and SGS3, word lines WL0 to WL3, and backgate line BG, and the other row decoder can select the select gate lines SGS0, SGS2, SGD1, and SGD3, and word lines WL4 to WL7. This arrangement can reduce the complexity of interconnections such as the select gate lines and word lines in the region (including the row decoder 11) between the driver circuit 12 and memory cell array 10.

Moreover, in each of the above embodiments, the semiconductor memory device is explained by taking a three-dimensionally stacked NAND flash memory as an example. However, the three-dimensionally stacked NAND flash memory is not limited to the arrangement show in FIGS. 3, 4, and 5. For example, the semiconductor layer 26 need not have a U-shape, and can also be a single pillar. In this arrangement, the transistor BT is unnecessary. Also, the embodiments are applicable not only to the three-dimensionally stacked memory, but also to, for example, a conventional NAND flash memory in which memory cells are two-dimensionally arranged in the plane of a semiconductor substrate. Furthermore, each embodiment is explained by taking the operation in which data is erased for each block BLK as an example, but the present embodiments are not limited to this. As an example, data may also be erased for each of the plurality of NAND strings.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of memory cells including current paths coupled in series, and each including a charge accumulation layer and a control gate, the plurality of memory cells being stacked above a semiconductor substrate;
a plurality of word lines coupled to the control gates;
a driver circuit configured to repeat a programming operation to write data in a memory cell coupled to a selected word line, wherein a first voltage is applied to the selected word line, a second voltage is applied to a first unselected word line, and a third voltage is applied to a second unselected word line, in the programming operation; and
a control circuit configured to step up the first voltage and step down the second voltage in repeating the programming operation;
wherein the first unselected word line is adjacent to the selected word line.

2. The device according to claim 1, wherein the control circuit steps down the second voltage after the number of times of repetition of the programming operation has reached a first count.

3. The device according to claim 1, wherein the control circuit holds the second voltage constant after the number of times of repetition of the programming operation has reached a second count.

4. The device according to claim 1, wherein
the memory cell is configured to hold data having not less than four levels in accordance with a threshold voltage, and
the second voltage is stepped down when writing a level having a highest threshold voltage among the not less than four levels.

5. The device according to claim 1, wherein the control circuit steps down the second voltage after the first voltage has reached a first threshold value.

6. The device according to claim 1, wherein the control circuit holds the second voltage constant after the first voltage has reached a second threshold value.

7. The device according to claim 1, wherein the control circuit holds the third voltage constant in repeating the programming operation.

8. The device according to claim 1, wherein the control circuit steps up the third voltage in repeating the programming operation.

9. The device according to claim 1, wherein
the second voltage and the third voltage turn on the memory cell, and
the first voltage is higher than the second voltage and the third voltage.

10. A data write method of a semiconductor memory device including a plurality of memory cells including current paths coupled in series, and stacked above a semiconductor substrate, comprising:
programming data in a selected memory cell by applying a first voltage to a gate of the selected memory cell, a second voltage to a gate of a first unselected memory cell, and a third voltage to a gate of a second unselected memory cell; and
repeating the programming while stepping up the first voltage and stepping down the second voltage;
wherein the first unselected memory cell is adjacent to the selected memory cell.

11. The method according to claim 10, wherein the second voltage is stepped down after the number of times of repetition of the programming has reached a first count.

12. The method according to claim 10, wherein the second voltage is held constant after the number of times of repetition of the programming has reached a second count.

13. The method according to claim 10, wherein
the memory cell is configured to hold data having not less than four levels in accordance with a threshold voltage, and
the second voltage is stepped down when writing a level having a highest threshold voltage among the not less than four levels.

14. The method according to claim 10, wherein the second voltage is stepped down after the first voltage has reached a first threshold value.

15. The method according to claim 10, wherein the second voltage is held constant after the first voltage has reached a second threshold value.

16. The method according to claim 10, wherein the third voltage is held constant in repeating the programming.

17. The method according to claim 10, wherein the third voltage is stepped up whenever the programming is repeated.

18. The method according to claim 10, wherein
the second voltage and the third voltage turn on the memory cell, and
the first voltage is higher than the second voltage and the third voltage.

* * * * *